US012792108B2

(12) United States Patent
Jang et al.

(10) Patent No.: US 12,792,108 B2
(45) Date of Patent: Nov. 10, 2026

(54) DISPLAY DEVICE

(71) Applicant: Samsung Display Co., LTD., Yongin-si (KR)

(72) Inventors: Min Sok Jang, Yongin-si (KR); Sung Guk An, Yongin-si (KR); Hirotsugu Kishimoto, Yongin-si (KR); Jong Bin Park, Yongin-si (KR); Jun Hun Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/041,647

(22) Filed: Jan. 30, 2025

(65) Prior Publication Data

US 2025/0383690 A1 Dec. 18, 2025

(30) Foreign Application Priority Data

Jun. 14, 2024 (KR) ........................ 10-2024-0077692

(51) Int. Cl.

| | |
|---|---|
| ***G06F 1/16*** | (2006.01) |
| *H10K 59/40* | (2023.01) |
| *H10K 59/80* | (2023.01) |
| *H10K 77/10* | (2023.01) |
| *H10K 102/00* | (2023.01) |

(52) U.S. Cl.

CPC .......... *G06F 1/1681* (2013.01); *G06F 1/1652* (2013.01); *H10K 59/40* (2023.02); *H10K 59/871* (2023.02); *H10K 77/111* (2023.02); *H10K 2102/311* (2023.02)

(58) Field of Classification Search

CPC ..................................................... G06F 1/1681

See application file for complete search history.

(56) References Cited

U.S. PATENT DOCUMENTS

| | | | | |
|---|---|---|---|---|
| 2019/0212780 A1 | 7/2019 | Choi et al. | | |
| 2020/0171787 A1* | 6/2020 | Lim | ........................ | B32B 27/06 |
| 2022/0256719 A1 | 8/2022 | Jang | | |
| 2023/0095925 A1* | 3/2023 | Kim | ........................ | G06F 3/041 361/679.01 |
| 2023/0102213 A1 | 3/2023 | Jang | | |
| 2024/0188233 A1 | 6/2024 | Jang | | |

FOREIGN PATENT DOCUMENTS

| | | | |
|---|---|---|---|
| CN | 113470521 | A | 10/2021 |
| KR | 10-2021-0067292 | A | 6/2021 |
| KR | 10-2322377 | B1 | 11/2021 |
| KR | 10-2022-0136523 | A | 10/2022 |
| KR | 10-2023-0023878 | A | 2/2023 |

OTHER PUBLICATIONS

Partial European Search Report in corresponding European Patent Application No. EP 25181918.1, dated Oct. 21, 2025, 17 pages.

* cited by examiner

*Primary Examiner* — Jerry Wu

(74) *Attorney, Agent, or Firm* — Womble Bond Dickinson (US) LLP

(57) ABSTRACT

Provided is a display device. The display device includes, a display panel, a panel support member disposed on the display panel, and a barrier film disposed between the display panel and the panel support member, wherein the panel support member includes, a first support, a second support spaced from the first support, and a differential pattern disposed between the first support and the second support and including first spacers and second spacers having different heights.

17 Claims, 22 Drawing Sheets

DISPLAY DEVICE

CROSS-REFERENCE TO RELATED APPLICATION

This application claims priority to and the benefit of Korean Patent Application No. 10-2024-0077692, filed on Jun. 14, 2024, in the Korean Intellectual Property Office, the entire content of which is incorporated herein by reference.

BACKGROUND

1. Field

One or more aspects of embodiments of the present disclosure relate to a display device.

2. Description of the Related Art

As communication technologies continue to advance and/or develop in the information society, the demand for devices capable of presenting images in various suitable forms is increasing. For example, the display devices are now integrated into a range of electronic devices, including smartphones, digital cameras, laptop computers, navigation devices, smart televisions, and/or the like.

To enhance and/or increase the portability of display devices and offer larger (e.g., wider) display screens, bendable display devices with flexible (bendable) display areas and foldable display devices with foldable display areas have recently been introduced.

SUMMARY

One or more aspects of embodiments of the present disclosure are directed toward a display device with enhanced impact resistance. However, aspects of the present disclosure are not restricted to those set forth herein.

The preceding and other aspects of the present disclosure will become more apparent to one of ordinary skill in the art to which the present disclosure pertains by referencing the detailed description of the present disclosure.

According to an embodiment of the present disclosure, there is provided a display device including, a display panel, a panel support member arranged on the display panel, and a barrier film arranged between the display panel and the panel support member, wherein the panel support member includes, a first support, a second support spaced and/or apart (e.g., spaced apart or separated) from the first support, and a differential pattern arranged between the first support and the second support and including first spacers and second spacers having different heights. For example, the differential pattern includes a plurality of first spacers and a plurality of second spacers, the first spacers and the second spacers having different heights.

In one or more embodiments, a height of each of the first spacers is greater than a height of each of the second spacers, and an upper surface of each of the first spacers is in direct contact with (e.g., on) a lower surface of the barrier film.

In one or more embodiments, an upper surface of the second spacer is spaced and/or apart (e.g., spaced apart or separated) from the lower surface of the barrier film.

In one or more embodiments, the display device may further include a lower visibility prevention member positioned on an opposite side of the barrier film with the panel support member interposed therebetween, and wherein a lower surface of the second spacer is spaced and/or apart (e.g., spaced apart or separated) from an upper surface of the lower visibility prevention member. For example, in one or more embodiments, the display device may include a lower visibility prevention member positioned on the opposite side of the barrier film, with the panel support member in between. Additionally, the lower surface of the second spacer is spaced and/or apart (e.g., spaced apart or separated) from the upper surface of the lower visibility prevention member.

In one or more embodiments, each of the first spacers and each of the second spacers are arranged to be spaced and/or apart (e.g., spaced apart or separated) from each other.

In one or more embodiments, a hole is arranged between the first spacer and the second spacer.

In one or more embodiments, the differential pattern further includes a bottom portion arranged below each of the first spacers and each of the second spacers, and a groove is arranged between the first spacer and the second spacer.

In one or more embodiments, a separation direction of the first support and the second support and an extension direction of the first spacers and the second spacers may each independently be the same (e.g., the separation direction of the first support and the second support is equal to an extension direction of each first spacer and each second spacer). For example, in one or more embodiments, the separation direction of the first and second supports and the extension direction of the first and second spacers may each independently be the same.

In one or more embodiments, a portion of the differential pattern protrudes to one side from the first support (e.g., a portion of the differential pattern protrudes from the first support to a first side), and another portion of the differential pattern protrudes to the other side that is different from the one side from the second support (e.g., another portion of the differential pattern protrudes from the second support to a second side different from the first side). For example, in one or more embodiments, a portion of the differential pattern protrudes from the first support to one side, while another portion protrudes from the second support to the opposite side.

In one or more embodiments, the first spacer and the second spacer are spaced and/or apart (e.g., spaced apart or separated) from each other in a direction different from the separation direction of the first support and the second support.

In one or more embodiments, a first direction, which is an extension direction of each the first spacers and each of the second spacers, and (e.g., is different than) a second direction, which is (e.g., being) a separation direction of the first support and the second support, are different directions.

In one or more embodiments, one end of the first support in the first direction further protrudes than one end of the differential pattern in the first direction. For example, in one or more embodiments, one end of the first support protrudes further in the first direction than one end of the differential pattern.

In one or more embodiments, the first spacer and the second spacer are spaced and/or apart (e.g., spaced apart or separated) from each other in the second direction.

In one or more embodiments, the display device may further include a buffer layer arranged on the differential pattern, wherein the buffer layer is in contact with (e.g., on) an upper surface or a lower surface of each of the first spacers.

In one or more embodiments, the buffer layer is arranged between the first support and the second support.

In one or more embodiments, a side surface of the buffer layer is spaced and/or apart (e.g., spaced apart or separated) from at least one of a side surface of the first support and/or a side surface of the second support.

In one or more embodiments, an upper surface of the buffer layer further protrudes than an upper surface of each of the first support and the second support, and the barrier film has a conformal shape along a protruding upper surface and a protruding side surface of the buffer layer.

According to an embodiment of the present disclosure, there is provided a display device including, a display panel, a panel support member arranged on the display panel and including a first support member and a second support member spaced and/or apart (e.g., spaced apart or separated) from the first support member, a barrier film arranged between the first support member and the second support member, and including a support layer, a first adhesive layer arranged on one side (e.g., first side) of the support layer, and a second adhesive layer arranged on the other side (e.g., second side) of the support layer, and a lower visibility prevention member arranged on the barrier film and the panel support member, wherein a separation direction of the first support member and the second support member is different from a stacking direction of the support layer, the first adhesive layer, and the second adhesive layer.

In one or more embodiments, the display device may further include a buffer layer arranged between the display panel and the panel support member, wherein the first adhesive layer is in direct contact with (e.g., on) the buffer layer, and the second adhesive layer is in direct contact with (e.g., on) the lower visibility prevention member.

In one or more embodiments, the display device may further include a buffer layer arranged between the barrier film and the lower visibility prevention member, wherein the second adhesive layer is in direct contact with (e.g., on) the buffer layer.

According to one or more embodiments, an electronic device may include the display device of the present disclosure, the display device comprising a folding area, a first non-folding area, and a second non-folding area, a first support member overlapping the first non-folding area, a second support member overlapping the second non-folding area, and a hinge overlapping the folding area.

According to one or more embodiments, the electronic device may be a smartphone, a television, a monitor, a tablet, an electric vehicle, a mobile phone, a tablet personal computer (PC), a mobile communication terminal, an electronic notebook, an electronic book, a portable multimedia player (PMP), a navigation device, an ultra-mobile PC (UMPC), a laptop computer, a billboard, an Internet of Things (IoT) device, a smartwatch, a watch phone, or a head-mounted display (HMD).

According to the display device according to one or more embodiments of the present disclosure, the impact resistance may be enhanced.

However, the effects of one or more embodiments are not restricted to the one set forth herein. The preceding and other effects of one or more embodiments will become more apparent to one of daily skill in the art to which one or more embodiments pertain by referencing the claims.

BRIEF DESCRIPTION OF THE DRAWINGS

The accompanying drawings are included to provide a further understanding of the preceding, and other aspects and features of the present disclosure are incorporated in and constitute a part of this specification. The drawings illustrate example embodiments that will become more apparent by describing in more detail embodiments thereof with reference to the attached drawings. In the drawings.

DETAILED DESCRIPTION

Figure 1:
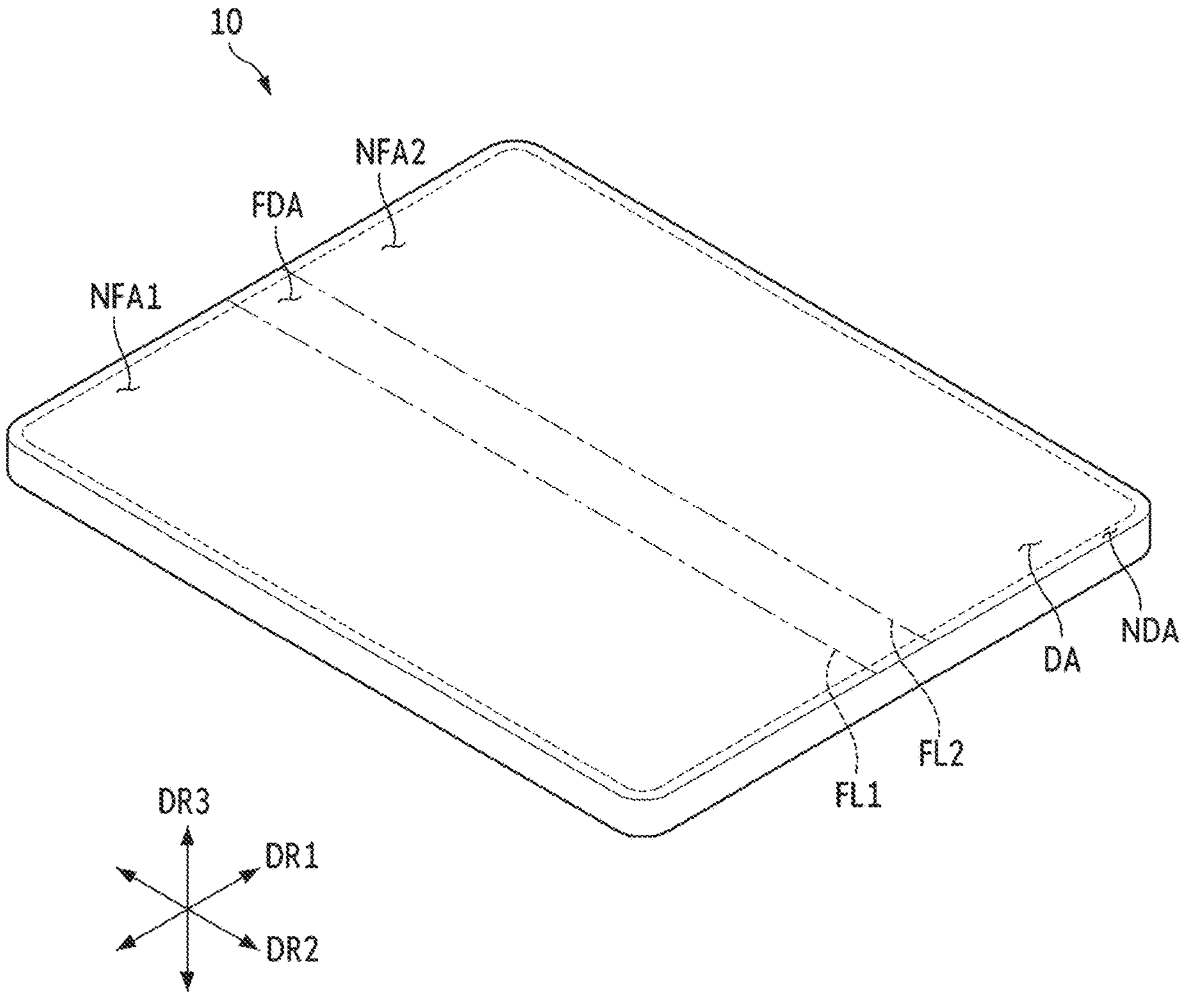
FIG. 1 is a perspective view illustrating a state in which a display device according to one or more embodiments is unfolded.

The present disclosure will now be described more fully hereinafter with reference to the accompanying drawings, in which one or more embodiments of present disclosure are shown. This present disclosure may, however, be embodied in different forms and should not be construed as limited to one or more embodiments set forth herein. Rather, these embodiments are provided so that this disclosure will be thorough and complete, and will filly convey the scope of present disclosure to those skilled in the art.

As used herein, the term "and/or" includes any and all combinations of one or more of the associated listed items. Expressions such as "at least one of," "one of," "selected from," and "selected from among," when preceding a list of elements, modify the entire list of elements and do not modify the individual elements of the list. For example, throughout the disclosure, the expression "at least one of a, b or c" indicates only a, only b, only c, both (e.g., simultaneously) a and b, both (e.g., simultaneously) a and c, both (e.g., simultaneously) b and c, all of a, b, and c, or variations thereof.

It will also be understood that if (e.g., when) one or more components such as a layer, substrate and/or the like is referred to as being "connected to," or "on" another layer or substrate, it may be directly on the other layer or substrate, or intervening layers may also be present. The same reference numbers indicate the same components throughout the specification.

Because the disclosure may have diverse modified embodiments, the embodiments are illustrated in the drawings and are described in the detailed description. An aspect and a characteristic of the disclosure, and a method of accomplishing these will be apparent if (e.g., when) referring to one or more embodiments described with reference to the drawings. The disclosure may, however, be embodied in many different forms and should not be construed as limited to the embodiments set forth herein.

Unless otherwise defined, all chemical names, technical and scientific terms, and terms defined in common dictionaries should be interpreted as having meanings consistent with the context of the related art, and should not be interpreted in an ideal or overly formal sense. It will be understood that although the terms "first," "second," and/or the like may be utilized herein to describe one or more suitable components, these components should not be limited by these terms. These terms are only utilized to distinguish one component from another. Thus, a first element could be termed a second element without departing from the teachings of the present disclosure. Similarly, a second element could be termed a first element. An expression utilized in the singular forms such as "a," "an," and "the" are intended to encompass the expression of the plural forms as well, unless it has a clearly different meaning in the context.

It will be further understood that the terms "comprises," "comprising," "comprise," "has," "have," "having," "include," "includes," and/or "including," as utilized herein specify the presence of stated features or elements, but do not preclude the presence or addition of one or more other features or elements.

The term "may" will be understood to refer to "one or more embodiments of the present disclosure," some of which include the described element and some of which exclude that element and/or include an alternate element. Similarly, alternative language such as "or" refers to "one or more embodiments of the present disclosure," each including a corresponding listed item.

Sizes of elements in the drawings may be exaggerated for convenience of explanation. In other words, because sizes and thicknesses of components in the drawings are arbitrarily illustrated for convenience of explanation, the following embodiments are not limited thereto.

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

In this context, "consisting essentially of" indicates that any additional components will not materially affect the chemical, physical, optical or electrical properties of the semiconductor film.

Further, in this specification, the phrase "on a plane," or "plan view," indicates viewing a target portion from the top, and the phrase "on a cross-section" indicates viewing a cross-section formed by vertically cutting a target portion from the side.

Hereinafter, embodiments of the present disclosure will be described in more detail with reference to the accompanying drawings.

Display Device

Figure 2:
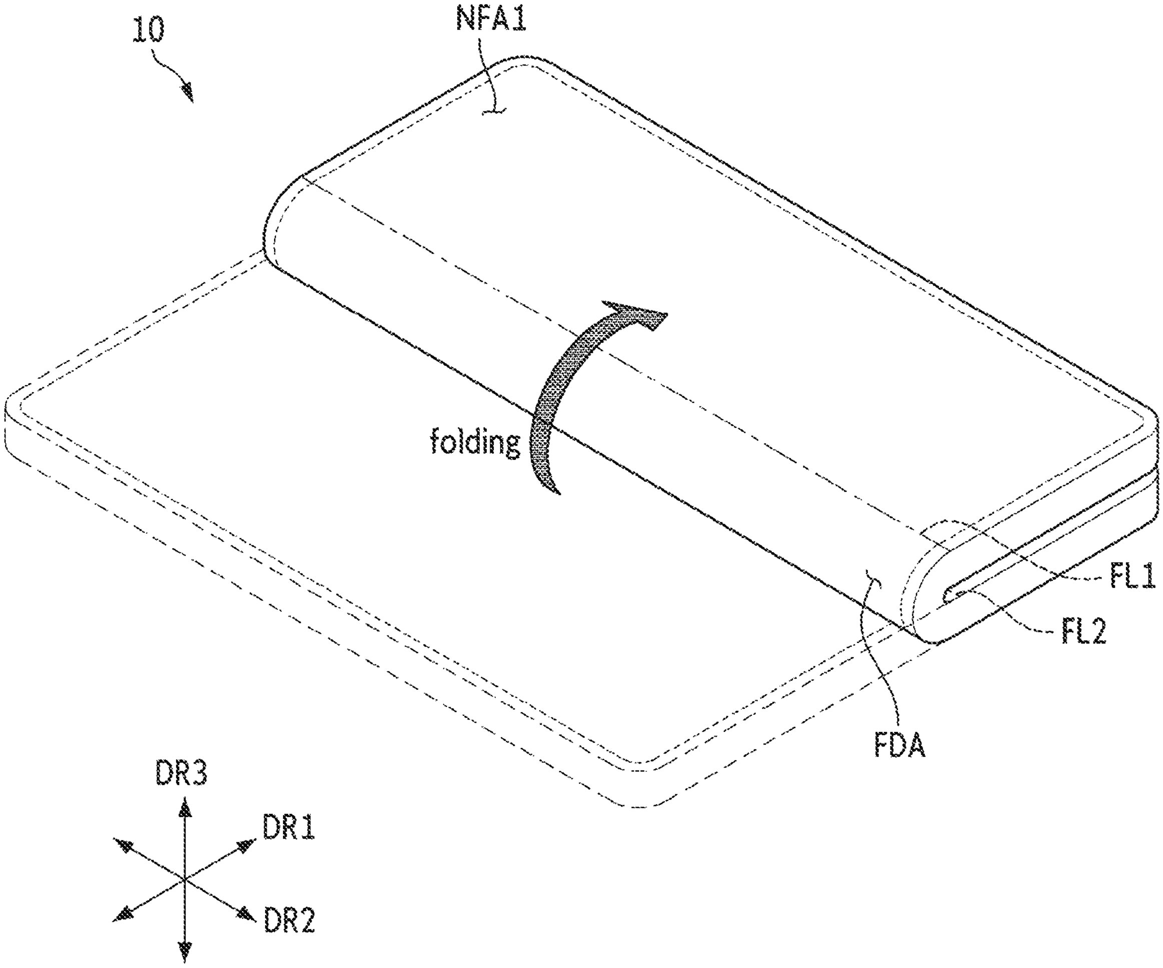
FIG. 2 is a perspective view illustrating a state in which a display device according to one or more embodiments is folded.

FIG. 1 is a perspective view illustrating a state in which a display device according to one or more embodiments is unfolded. FIG. 2 is a perspective view illustrating a state in which a display device according to one or more embodiments is folded.

Referring to FIGS. 1 and 2, FIG. 1 illustrates a first state of a display device 10 in which the display device 10 is unfolded without being folded at folding lines FL1 and FL2, and FIG. 2 illustrates a second state of the display device 10 in which the display device 10 is folded at the folding lines FL1 and FL2.

The display device 10 according to one or more embodiments is a device that displays a moving image or a still image, and may be used as a display screen of each of one or more suitable products (e.g., electronic devices) such as a television, a laptop computer, a monitor, a billboard, and Internet of Things (IOT) as well as portable electronic devices such as a mobile phone, a smartphone, a tablet personal computer (PC), a smartwatch, a watch phone, a mobile communication terminal, an electronic organizer, an electronic book, a portable multimedia player (PMP), a navigation device, and an ultra-mobile PC (UMPC).

In the drawings, a first direction DR1 may be a direction parallel to one side (e.g., first side) of the display device 10 if (e.g., when) viewed on a plane (in a plan view), for example, a horizontal direction of the display device 10. A second direction DR2 may be a direction parallel to the other side (e.g., second side) in contact with one side of the display device 10 if (e.g., when) viewed on a plane (in a plan view), and may be a vertical direction of the display device 10. A third direction DR3 may be a thickness direction of the display device 10.

A planar shape of the display device 10 may be a quadrangular shape such as a rectangle. Each corner of the display device 10 may have a right-angled planar shape or a round planar shape. A front surface of the display device 10 may include two short sides arranged in the first direction DR1 and two long sides arranged in the second direction DR2. In a plan view, the display device 10 appears as a flat, two-dimensional shape.

The display device 10 may include a display area DA and a non-display area NDA. A planar shape of the display area DA may follow the shape of the display device 10. For example, if (e.g., when) the planar shape of the display device 10 is a rectangle, the planar shape of the display area DA may also be a rectangle.

The display area DA may be an area including a plurality of pixels to display an image. The non-display area NDA may be an area that does not include the pixels and does not display the image. The non-display area NDA may be arranged around the display area DA. The non-display area NDA may be arranged to be around (e.g., surround) the display area DA, but one or more embodiments of the present disclosure is not limited thereto. The display area DA may be partially surrounded by the non-display area NDA.

The display device 10 may maintain both (e.g., simultaneously) the first state in which the display device 10 is unfolded and the second state in which the display device 10 is folded. In one or more embodiments, the display device 10 may be folded in an in-folding manner so that the display areas DA face each other, as illustrated in FIG. 2. In this case, the front surfaces of the display device 10 may face each other if (e.g., when) folded. In one or more embodiments, the display device 10 may be folded in an out-folding manner so that the back surfaces thereof face each other.

The display device 10 may include a folding area FDA, a first non-folding area NFA1, and a second non-folding area NFA2. The folding area FDA may be an area in which the display device 10 is bent or folded, and the first non-folding area NFA1 and the second non-folding area NFA2 may be areas in which the display device 10 is not bent or folded. In one or more embodiments, the first non-folding area NFA1 and the second non-folding area NFA2 may be flat areas of the display device 10.

The first non-folding area NFA1 may be arranged on one side (e.g., first side) of the folding area FDA, for example, a left side thereof. The second non-folding area NFA2 may be arranged on the other side (e.g., second side) of the folding area FDA, for example, a right side thereof. The folding area FDA is an area defined by the first folding line FL1 and the second folding line FL2 and may be an area in which the display device 10 is bent with a set or predetermined curvature. The first folding line FL1 may be a boundary between the folding area FDA and the first non-folding area NFA1, and the second folding line FL2 may be a boundary between the folding area FDA and the second non-folding area NFA2.

As illustrated in FIGS. 1 and 2, the first folding line FL1 and the second folding line FL2 may extend in the second direction DR2, and in this case, the display device 10 may be folded based on the second direction DR2. Accordingly, because a length of the display device 10 in the first direction DR1 may be reduced by approximately (about) half, it may be convenient for the user to carry the display device 10.

The first non-folding area NFA1 may be arranged on one side (e.g., first side) of the folding area FDA, for example, a left side thereof. The second non-folding area NFA2 may be arranged on the other side (e.g., second side) of the folding area FDA, for example, a right side thereof. Here, the left side may refer to one side (e.g., first side) in the first direction DR1, and the right side may refer to the other side (e.g., second side) in the first direction DR1.

When the first folding line FL1 and the second folding line FL2 extend in the second direction DR2 as illustrated in FIGS. 1 and 2, a length of the folding area FDA in the second direction DR2 may be longer than a length thereof in the first direction DR1. In some embodiments, a length of the first non-folding area NFA1 in the second direction DR2 may be longer than a length of the first non-folding area NFA1 in the first direction DR1. A length of the second non-folding area NFA2 in the second direction DR2 may be longer than a length of the second non-folding area NFA2 in the first direction DR1.

Each of the display area DA and the non-display area NDA may overlap at least one of the folding area FDA, the first non-folding area NFA1, and the second non-folding area NFA2. It is illustrated in FIGS. 1 and 2 that the display area DA and the non-display area NDA each overlap the folding area FDA, the first non-folding area NFA1, and the second non-folding area NFA2.

Figure 3:
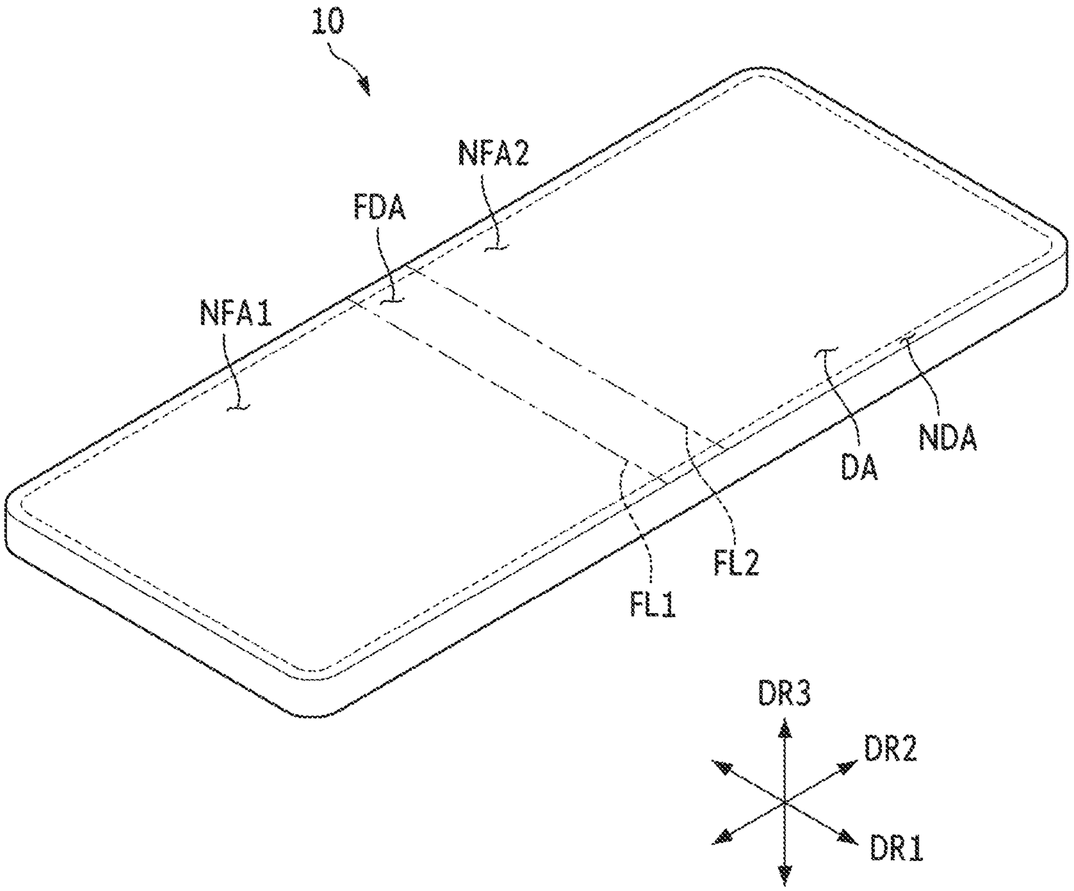
FIG. 3 is a perspective view illustrating a state in which a display device according to one or more embodiments is unfolded.
Figure 4:
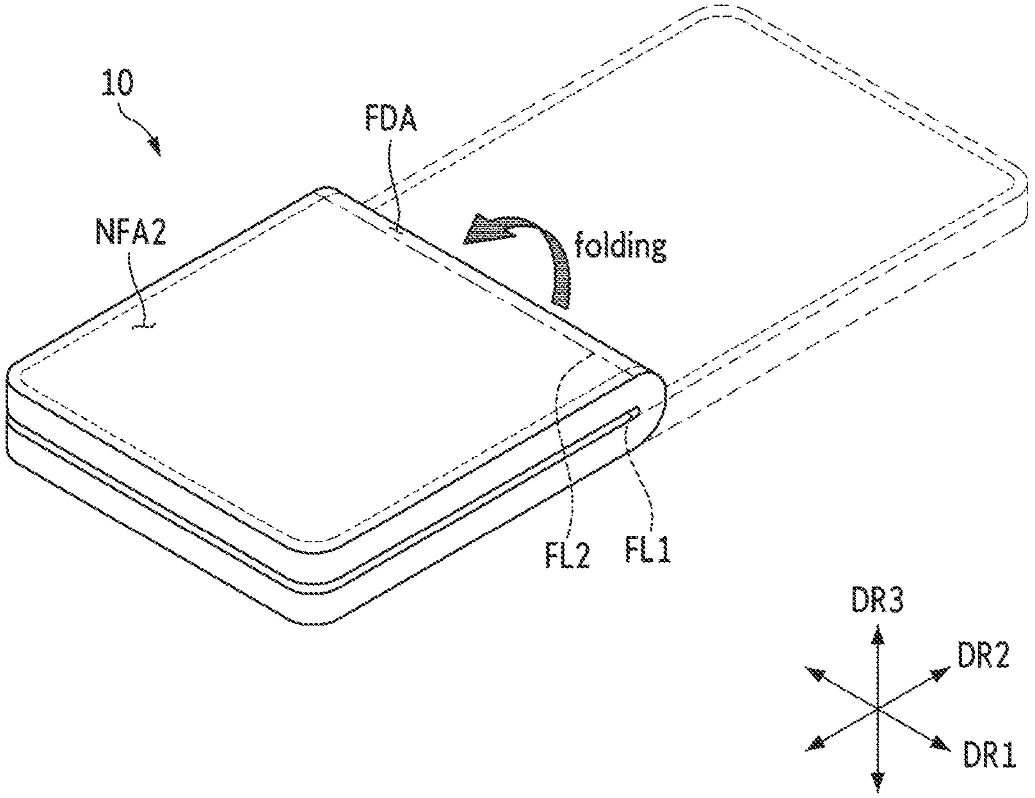
FIG. 4 is a perspective view illustrating a state in which a display device according to one or more embodiments is folded.

FIG. 3 is a perspective view illustrating a state in which a display device according to one or more embodiments is unfolded. FIG. 4 is a perspective view illustrating a state in which a display device according to one or more embodiments is folded.

Referring to FIGS. 3 and 4 together with FIGS. 1 and 2, FIG. 3 illustrates a first state of the display device 10 in which the display device 10 is unfolded without being folded at the folding lines FL1 and FL2, and FIG. 4 illustrates a second state of the display device 10 in which the display device 10 is folded at the folding lines FL1 and FL2.

The embodiment of FIGS. 3 and 4 is different from one or more embodiments of FIGS. 1 and 2 only in that the length of the display device 10 in the second direction DR2 is reduced by approximately half because the first folding line FL1 and the second folding line FL2 extend in the first direction DR1 and the display device 10 is folded in the second direction DR2. Therefore, in FIGS. 3 and 4, descriptions that overlap with one or more embodiments of FIGS. 1 and 2 will not be provided.

In the first state in which the display device 10 is unfolded, the long side of the display device 10 may extend along the second direction DR2, and the short side of the display device 10 may extend along the first direction DR1.

As illustrated in FIGS. 3 and 4, the first folding line FL1 and the second folding line FL2 may extend in the first direction DR1, and in this case, the display device 10 may be folded based on the first direction DR1.

The first non-folding area NFA1 may be arranged on one side (e.g., first side) of the folding area FDA, for example, a lower side thereof. The second non-folding area NFA2 may be arranged on the other side (e.g., second side) of the folding area FDA, for example, an upper side thereof. Here, the upper side may refer to one side in the second direction DR2, and the lower side may refer to the other side (e.g., second side) in the second direction DR2.

When the first folding line FL1 and the second folding line FL2 extend in the first direction DR1 as illustrated in FIGS. 3 and 4, a length of the folding area FDA in the first direction DR1 may be longer than a length thereof in the second direction DR2. In some embodiments, a length of the first non-folding area NFA1 in the second direction DR2 may be longer than a length of the first non-folding area NFA1 in the first direction DR1. A length of the second non-folding area NFA2 in the second direction DR2 may be longer than a length of the second non-folding area NFA2 in the first direction DR1.

Hereinafter, for convenience of explanation, one or more embodiments of FIGS. 3 and 4 will be used as an example, but the present disclosure is not limited thereto, and the following may also be equally applied to one or more embodiments of FIGS. 1 and 2.

Figure 5:
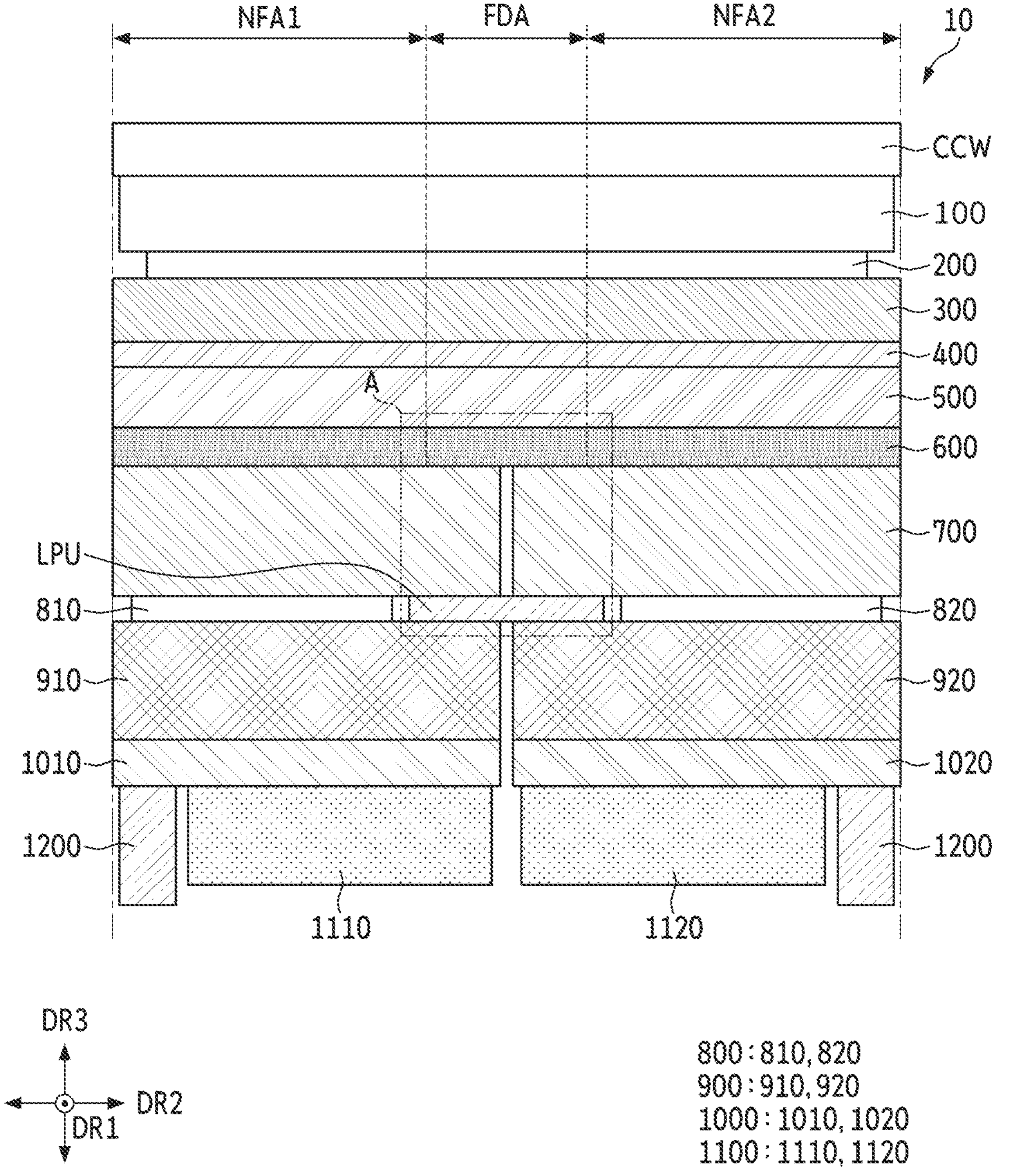
FIG. 5 is a cross-sectional view illustrating the display device according to one or more embodiments.

FIG. 5 is a cross-sectional view illustrating the display device according to one or more embodiments.

Referring to FIG. 5, the display device 10 according to one or more embodiments may include a cover window CCW, an upper protective member 100, a window member 200, an optical member 300, a display panel 400, a panel protective member 500, a barrier film 600, a panel support member 700, an adhesive member 800, a lower visibility prevention member LPU, a digitizer member 900, a metal support member 1000, a buffer member 1100, and a permeation prevention member 1200.

The display panel 400 may be a panel that displays an image. The display panel 400 may be an organic light emitting display panel including an organic light emitting layer, a quantum dot light emitting display panel including a quantum dot light emitting layer, an inorganic light emitting display panel using an inorganic semiconductor element as a light emitting element, and a micro light emitting display panel that uses a micro light emitting diode as a light emitting element. Hereinafter, the display panel 400 is mainly described as an organic light emitting display panel, but the present disclosure is not limited thereto. A detailed structure of the display panel 400 will be described in more detail later with reference to FIG. 6.

The optical member 300 may be arranged on one surface of the display panel 400. For example, the optical member 300 may be arranged on an upper surface of the display panel 400. The optical member 300 may include a polarizing film and/or a retardation film. The optical member 300 may reduce or prevent external light reflection.

The window member 200 may be arranged on the optical member 300. The window member 200 is made of a transparent material, and may be, for example, glass or plastic. For example, the window member 200 may be an ultra-thin glass (UTG) or a transparent polyimide film having a thickness of 0.1 millimeter (mm) or less.

The upper protective member 100 may be arranged on the window member 200. The upper protective member 100 may perform at least one function of anti-scattering, shock absorption, anti-engraving, anti-fingerprint, and anti-glaring of the window member 200. The upper protective member 100 may include at least one of polyacrylate, polyethylene terephthalate (PET), and polyimide (PI).

The cover window CCW may be arranged on the upper protective member 100. The cover window CCW may be a protective film for protecting the display device 10 from external shock. The cover window CCW may be attached to or removed from the display device 10 through an adhesive member. For example, the cover window CCW may be a changeable window. In one or more embodiments, the cover window CCW may include, but is not limited to, at least one of flexible polyethylene terephthalate (PET) and thermoplastic polyurethane (TPU).

The panel protective member 500 may be arranged on the other surface of the display panel 400. For example, the panel protective member 500 may be arranged on a lower surface of the display panel 400. The panel protective member 500 may serve to support the display panel 400 and protect the lower surface of the display panel 400. The panel protective member 500 may be made of plastic such as polyethylene terephthalate (PET) or polyimide. It is illustrated in the drawings that the panel protective member 500 is also arranged in the folding area FDA of the display device 10, but one or more embodiments of the present specification is not limited thereto. For example, the panel protective member 500 may be removed from the folding area FDA to allow the display device 10 to be smoothly folded.

The panel protective member 500 may be provided together with the display panel 400 during a process of manufacturing the display panel 400. For example, the panel protective member 500 may be provided in a state being attached to the display panel 400 to protect the display panel 400 during the process of manufacturing the display panel 400. Thereafter, the members arranged on the display panel 400 and the members arranged below the panel protective member 500 may be attached through a module process in the state in which the display panel 400 and the panel protective member 500 are attached.

The barrier film 600 may be arranged on the panel protective member 500. For example, the barrier film 600 may be arranged on a lower surface of the panel protective member 500. The barrier film 600 may be a member for enhancing impact resistance of the display device 10. In one or more embodiments, the barrier film 600 may include a support layer 610 (see FIG. 7) for enhancing the impact resistance, and adhesive layers 620 and 630 (see FIG. 7) arranged on upper and lower portions of the support layer 610 (see FIG. 7).

In the display device 10 according to the present embodiment, the barrier film 600 may be attached onto the panel protective member 500 during the module process after the process of manufacturing the display panel 400. Unlike the panel protective member 500 attached to protect the display panel 400, the barrier film 600 may be a film attached separately during the module process to enhance the impact resistance of the display device 10. For example, the barrier film 600 may have a different thickness (e.g., a height in the third direction DR3) from the panel protective member 500.

The panel support member 700 may be arranged on the barrier film 600. For example, the panel support member 700 may be arranged on a lower surface of the barrier film 600. The panel support member 700 may be a rigid member whose shape or volume is not easily changed by pressure from the outside. Because the panel support member 700 is arranged on the lower surface of the display panel 400 and is the rigid member whose shape or volume does not easily change by the pressure from the outside, the panel support member 700 may support the display panel 400.

In one or more embodiments, the panel support member 700 may be formed of a polymer including carbon fiber or glass fiber. In this case, the panel support member 700 may pass the magnetic field or electromagnetic signal of the digitizer member 900 because of being formed of the polymer including carbon fiber or glass fiber. Therefore, the panel support member 700 capable of supporting the display panel 400 while not lowering a touch sensitivity of the digitizer member 900 may be provided.

In one or more embodiments, the panel support member 700 may be a metal plate. For example, the panel support member 700 is a metal plate and may be made of metal or a metal alloy. The panel support member 700 may include, but is not limited to, copper (Cu), aluminum (Al), stainless steel (SUS), and/or an alloy thereof.

The panel support member 700 may include a differential pattern arranged in the folding area FDA so as to be easily bent in the folding area FDA. As the panel support member 700 includes the differential pattern arranged in the folding area FDA, the panel support member 700 may be easily bent if (e.g., when) the display device 10 is folded. The panel support member 700 and the differential pattern thereof will be described in more detail later with reference to FIG. 8.

The lower visibility prevention member LPU may be arranged on the panel support member 700. For example, the lower visibility prevention member LPU may be arranged on a lower surface of the panel support member 700. The lower visibility prevention member LPU may be arranged to overlap the folding area FDA. The lower visibility prevention member LPU may be arranged on the same layer as the adhesive member 800. The lower visibility prevention member LPU may be arranged between a first adhesive member

810 and a second adhesive member 820. The lower visibility prevention member LPU may prevent or reduce the differential pattern of the panel support member 700 from being visually recognized to the outside. In some embodiments, the lower visibility prevention member LPU may include a flexible material to reduce folding stress of the display device 10. For example, the lower visibility prevention member LPU may include thermoplastic polyurethane (TPU).

The adhesive member 800 may be arranged on the panel support member 700. The adhesive member 800 may be arranged on the lower surface of the panel support member 700. The adhesive member 800 may be arranged between the panel support member 700 and the digitizer member 900. The panel support member 700 and the digitizer member 900 may be coupled to each other through the adhesive member 800. The adhesive member 800 may include a transparent adhesive such as a pressure sensitive adhesive (PSA) or an optically clear adhesive (OCA). The adhesive member 800 may include an acrylic adhesive material.

In one or more embodiments, the adhesive member 800 may include a first adhesive member 810 overlapping a first digitizer member 910 and a second adhesive member 820 overlapping a second digitizer member 920. The first adhesive member 810 and the second adhesive member 820 may be arranged to be spaced and/or apart (e.g., spaced apart or separated) from each other with the lower visibility prevention member LPU interposed therebetween.

The digitizer member 900 may be arranged on the panel support member 700. For example, the digitizer member 900 may be arranged on the lower surface of the panel support member 700. The digitizer member 900 may include a first digitizer member 910 and a second digitizer member 920. The first digitizer member 910 and the second digitizer member 920 may be attached to the lower surface of the panel support member 700 by the first adhesive member 810 and the second adhesive member 820, respectively.

The first digitizer member 910 and the second digitizer member 920 may not be arranged in the folding area FDA to reduce folding stress of the display device 10. The first digitizer member 910 may be arranged in the first non-folding area NFA1, and the second digitizer member 920 may be arranged in the second non-folding area NFA2. A gap between the first digitizer member 910 and the second digitizer member 920 may overlap the folding area FDA and may be smaller than a width of the folding area FDA. The width of the folding area FDA may be the length of the folding area FDA in the second direction DR2.

The first digitizer member 910 and the second digitizer member 920 may include electrode patterns for sensing approach or contact of an electronic pen such as a stylus pen supporting electromagnetic resonance (EMR). The first digitizer member 910 and the second digitizer member 920 may sense a magnetic field or electromagnetic signal emitted from the electronic pen based on the electrode patterns, and may determine a point where the sensed magnetic field or electromagnetic signal is greatest as touch coordinates.

Magnetic metal powder may be arranged on a lower surface of the first digitizer member 910 and a lower surface of the second digitizer member 920. In this case, the magnetic field or electromagnetic signal passing through the first digitizer member 910 and the second digitizer member 920 may flow into the magnetic metal powder. Therefore, due to the magnetic metal powder, emission of the magnetic field or electromagnetic signal from the first digitizer member 910 and the second digitizer member 920 to the lower surface of the display device 10 may be reduced.

In one or more embodiments, the digitizer member 900 may not be provided.

The metal support member 1000 may include a first metal support member 1010 and a second metal support member 1020. The first metal support member 1010 may be arranged on the lower surface of the first digitizer member 910, and the second metal support member 1020 may be arranged on the lower surface of the second digitizer member 920.

The first metal support member 1010 and the second metal support member 1020 may not be arranged in the folding area FDA to reduce folding stress of the display device 10. The first metal support member 1010 may be arranged in the first non-folding area NFA1, and the second metal support member 1020 may be arranged in the second non-folding area NFA2. A gap between the first metal support member 1010 and the second metal support member 1020 may overlap the folding area FDA and may be smaller than the width of the folding area FDA.

The first metal support member 1010 and the second metal support member 1020 may include a material having high rigidity to support the first digitizer member 910 and the second digitizer member 920. For example, the first metal support member 1010 and the second metal support member 1020 may include stainless steel such as SUS316 (316 Stainless Steel).

The buffer member 1100 may include a first buffer member 1110 and a second buffer member 1120. The first buffer member 1110 and the second buffer member 1120 may be to absorb external shocks and prevent or reduce the panel support member 700 and the digitizer member 900 from being damaged. The first buffer member 1110 and the second buffer member 1120 may include a material having elasticity, such as a sponge made by foaming and molding rubber, urethane-based materials, or acrylic-based materials.

The first buffer member 1110 may be arranged on a lower surface of the first metal support member 1010, and the second buffer member 1120 may be arranged on a lower surface of the second metal support member 1020. The first buffer member 1110 and the second buffer member 1120 may not be arranged in the folding area FDA to reduce folding stress of the display device 10. The first buffer member 1110 may be arranged in the first non-folding area NFA1, and the second buffer member 1120 may be arranged in the second non-folding area NFA2. A gap between the first buffer member 1110 and the second buffer member 1120 may overlap the folding area FDA and may be smaller than the width of the folding area FDA.

The permeation prevention member 1200 may be arranged on the lower surface of the first metal support member 1010 and the lower surface of the second metal support member 1020. The permeation prevention member 1200 may be arranged at an edge of the first metal support member 1010 and an edge of the second metal support member 1020. It is illustrated in the drawing that the permeation prevention member 1200 is arranged on both sides (e.g., opposite sides) of the first buffer member 1110 and the second buffer member 1120, but the present disclosure is not limited thereto. For example, the permeation prevention member 1200 may be arranged to be around (e.g., surround) the first buffer member 1110 and the second buffer member 1120.

The permeation prevention member 1200 may be a waterproof tape or a waterproof member attached to a front surface of a frame arranged on the lower surface of the first metal support member 1010 and the lower surface of the buffer member 1100. As a result, the permeation prevention member 1200 may prevent or reduce moisture or dust from permeating into the display device 10. For example, a display device 10 that is waterproof and dustproof may be provided.

In one or more embodiments, the permeation prevention member 1200 does not surround (is not around) the first buffer member 1110 and the second buffer member 1120, but may be arranged to overlap a magnet for maintaining the folding of the display device 10 in the third direction DR3. In this case, the permeation prevention member 1200 may serve as a magnetic shielding member capable of shielding magnetism to prevent or reduce the digitizer member 900 or the display panel 400 from being affected by the magnetism of the magnet.

Figure 6:
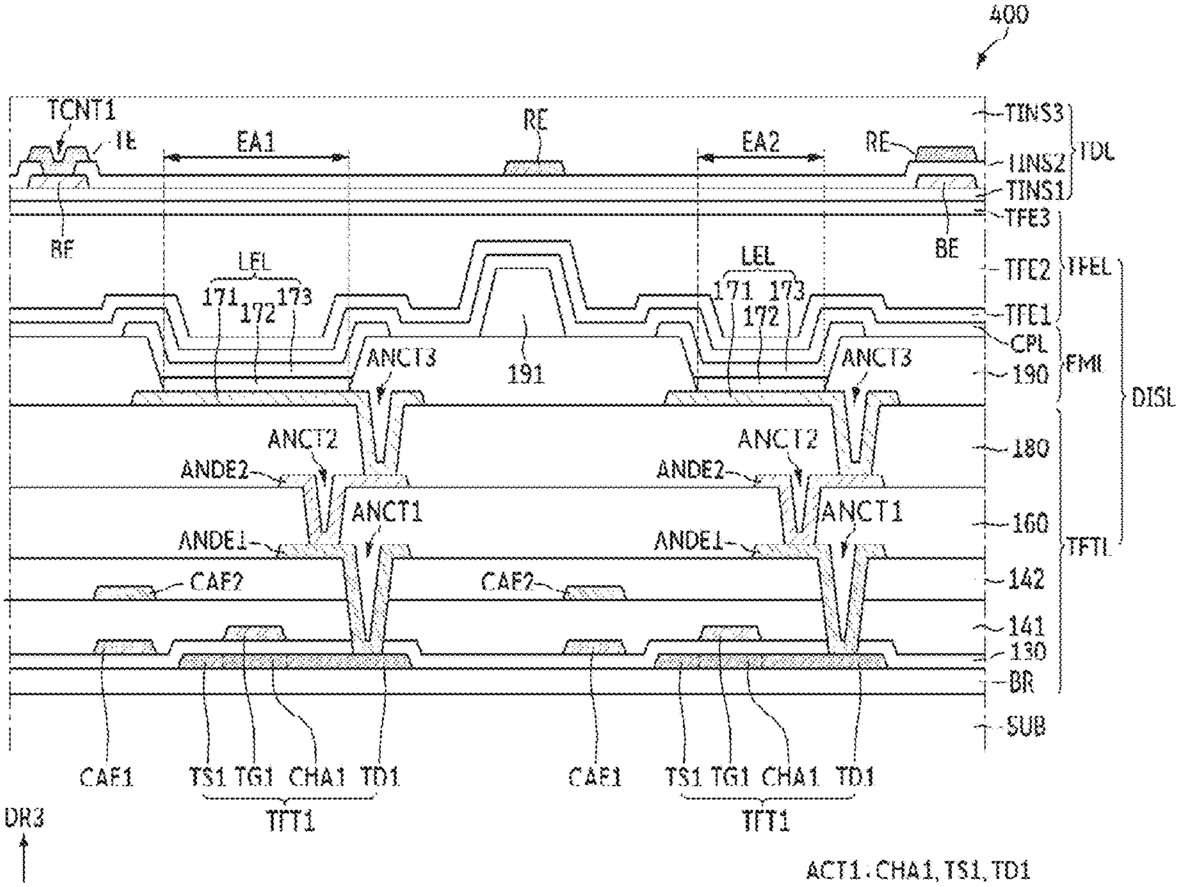
FIG. 6 is a cross-sectional view illustrating an example of a display panel according to one or more embodiments.

FIG. 6 is a cross-sectional view illustrating an example of a display panel according to one or more embodiments.

Referring to FIG. 6, the display panel 400 may include a substrate SUB, a display layer DISL arranged on the substrate SUB, and a touch sensing layer TDL arranged on the display layer DISL. The display layer DISL may include a thin film transistor layer TFTL, a light emitting element layer EML, and an encapsulation layer TFEL.

The thin film transistor layer TFTL may be arranged on the substrate SUB. The thin film transistor layer TFTL may include a barrier film BR, a thin film transistor TFT1, a first capacitor electrode CAE1, a second capacitor electrode CAE2, a first anode connection electrode ANDE1, a second anode connection electrode ANDE2, a gate insulating film 130, a first interlayer insulating film 141, a second interlayer insulating film 142, a first planarization film 160, and a second planarization film 180.

The substrate SUB may be made of an insulating material such as a polymer resin. For example, the substrate SUB may be made of polyimide. The substrate SUB may be a flexible substrate that may be bent, folded, rolled, and/or the like.

A barrier film BR may be arranged on the substrate SUB. The barrier film BR is a film for protecting thin film transistors of the thin film transistor layer TFTL and a light emitting layer 172 of the light emitting element layer EML from moisture permeating through the substrate SUB vulnerable to moisture permeation. The barrier film BR may include a plurality of inorganic films alternately stacked. For example, the barrier film BR may be formed as a multi-film in which one or more inorganic films of a silicon nitride layer, a silicon oxynitride layer, a silicon oxide layer, a titanium oxide layer, and an aluminum oxide layer are alternately stacked.

The thin film transistor TFT1 may be arranged on the barrier film BR. An active layer ACT1 of the thin film transistor TFT1 may be arranged on the barrier film BR. The active layer ACT1 of the thin film transistor TFT1 may include polycrystalline silicon, single crystal silicon, low-temperature polycrystalline silicon, amorphous silicon, or an oxide semiconductor.

The active layer ACT1 may include a channel region CHA1, a source region TS1, and a drain region TD1. The channel region CHA1 may be a region overlapping a gate electrode TG1 in the third direction DR3 that is a thickness direction of the substrate SUB. The source region TS1 may be arranged on one side (e.g., first side) of the channel region CHA1, and the drain region TD1 may be arranged on the other side (e.g., second side) of the channel region CHA1. The source region TS1 and the drain region TD1 may be regions that do not overlap the gate electrode TG1 in the third direction DR3. The source region TS1 and the drain region TD1 may be regions having conductivity by doping a silicon semiconductor or an oxide semiconductor with ions or impurities.

The gate insulating film 130 may be arranged on the active layer ACT1 of the thin film transistor TFT1. The gate insulating film 130 may be formed as an inorganic film, for example, a silicon nitride layer, a silicon oxynitride layer, a silicon oxide layer, a titanium oxide layer, or an aluminum oxide layer.

The gate electrode TG1 of the thin film transistor TFT1 and the first capacitor electrode CAE1 may be arranged on the gate insulating film 130. The gate electrode TG1 may overlap the channel region CHA1 in the third direction DR3. It is illustrated in FIG. 6 that the gate electrode TG1 and the first capacitor electrode CAE1 are arranged to be spaced and/or apart (e.g., spaced apart or separated) from each other, but the gate electrode TG1 and the first capacitor electrode CAE1 may be connected to each other and integrally formed. The gate electrode TG1 and the first capacitor electrode CAE1 may be formed as a single layer or a multi-layer made of any one of molybdenum (Mo), aluminum (Al), chromium (Cr), gold (Au), titanium (Ti), nickel (Ni), neodymium (Nd), and/or copper (Cu), and/or an alloy thereof.

The first interlayer insulating film 141 may be arranged on the gate electrode TG1 of the thin film transistor TFT1 and the first capacitor electrode CAE1. The first interlayer insulating film 141 may be formed as an inorganic film, for example, a silicon nitride layer, a silicon oxynitride layer, a silicon oxide layer, a titanium oxide layer, or an aluminum oxide layer. The first interlayer insulating film 141 may be formed as a plurality of inorganic films.

The second capacitor electrode CAE2 may be arranged on the first interlayer insulating film 141. The second capacitor electrode CAE2 may overlap the first capacitor electrode CAE1 of the thin film transistor TFT1 in the third direction DR3. In some embodiments, if (e.g., when) the gate electrode TG1 and the first capacitor electrode CAE1 are integrally formed, the second capacitor electrode CAE2 may overlap the gate electrode TG1 in the third direction DR3. Because the first interlayer insulating film 141 has a set or predetermined dielectric constant, a capacitor may be formed by the first capacitor electrode CAE1, the second capacitor electrode CAE2, and the first interlayer insulating film 141 arranged between the first capacitor electrode CAE1 and the second capacitor electrode CAE2. The second capacitor electrode CAE2 may be formed as a single layer or a multi-layer made of any one of molybdenum (Mo), aluminum (Al), chromium (Cr), gold (Au), titanium (Ti), nickel (Ni), neodymium (Nd), and/or copper (Cu), and/or one or more alloys thereof.

The second interlayer insulating film 142 may be arranged on the second capacitor electrode CAE2. The second interlayer insulating film 142 may be formed as an inorganic film, for example, a silicon nitride layer, a silicon oxynitride layer, a silicon oxide layer, a titanium oxide layer, or an aluminum oxide layer. The second interlayer insulating film 142 may be formed as a plurality of inorganic films.

A first anode connection electrode ANDE1 may be arranged on the second interlayer insulating film 142. The first anode connection electrode ANDE1 may be connected to the drain region TD1 of the thin film transistor TFT1 through a first connection contact hole ANCT1 penetrating through the gate insulating film 130, the first interlayer insulating film 141, and the second interlayer insulating film 142. The first anode connection electrode ANDE1 may be formed as a single layer or a multi-layer made of any one of molybdenum (Mo), aluminum (Al), chromium (Cr), gold (Au), titanium (Ti), nickel (Ni), neodymium (Nd), and/or copper (Cu), and/or an alloy thereof.

The first planarization film 160 for planarizing a step (e.g., act or task) due to the thin film transistor TFT1 may be arranged on the first anode connection electrode ANDE1. The first planarization film 160 may be formed as an organic film made of an acryl resin, an epoxy resin, a phenolic resin, a polyamide resin, a polyimide resin, and/or the like.

A second anode connection electrode ANDE2 may be arranged on the first planarization film 160. The second anode connection electrode ANDE2 may be connected to the first anode connection electrode ANDE1 through a second connection contact hole ANCT2 penetrating through the first planarization film 160. The second anode connection electrode ANDE2 may be formed as a single layer or a multi-layer made of any one of molybdenum (Mo), aluminum (Al), chromium (Cr), gold (Au), titanium (Ti), nickel (Ni), neodymium (Nd), and/or copper (Cu), and/or an alloy thereof.

The second planarization film 180 may be arranged on the second anode connection electrode ANDE2. The second planarization film 180 may be formed as an organic film made of an acryl resin, an epoxy resin, a phenolic resin, a polyamide resin, a polyimide resin, and/or the like.

The light emitting element layer EML including light emitting elements LEL and a bank 190 may be arranged on the second planarization film 180. Each of the light emitting elements LEL includes a pixel electrode 171, a light emitting layer 172, and a common electrode 173.

The pixel electrode 171 may be arranged on the second planarization film 180. The pixel electrode 171 may be connected to the second anode connection electrode ANDE2 through a third connection contact hole ANCT3 penetrating through the second planarization film 180.

In a top emission structure that emits light in a direction of the common electrode 173 with respect to the light emitting layer 172, the pixel electrode 171 may be formed of a metal material having high reflectance, such as a stacked structure (Ti/Al/Ti) of aluminum (Al) and titanium (Ti), a stacked structure (ITO/Al/ITO) of aluminum (Al) and indium tin oxide (ITO), a stacked structure (ITO/Ag/ITO) of silver (Ag) and indium tin oxide (ITO), an APC alloy, and/or a stacked structure (ITO/APC/ITO) of an APC alloy and ITO. The APC alloy is an alloy of silver (Ag), palladium (Pd), and copper (Cu).

The bank 190 may be formed to partition the pixel electrode 171 on the second planarization film 180 to define light emitting portions EA1 and EA2. The bank 190 may be arranged to cover an edge of the pixel electrode 171. The bank 190 may be formed as an organic film made of an acrylic resin, an epoxy resin, a phenolic resin, a polyamide resin, or a polyimide resin.

Each of a first light emitting portion EA1 and a second light emitting portion EA2 refers to each area in which the pixel electrode 171, the light emitting layer 172, and the common electrode 173 are sequentially stacked and holes from the pixel electrode 171 and electrons from the common electrode 173 are recombined with each other in the light emitting layer 172 to emit light.

The light emitting layer 172 may be arranged on the pixel electrode 171 and the bank 190. The light emitting layer 172 may include an organic material to emit light of a set or predetermined color. For example, the light emitting layer 172 may include a hole transporting layer, an organic material layer, and an electron transporting layer.

The common electrode 173 may be arranged on the light emitting layer 172. The common electrode 173 may be arranged to cover the light emitting layer 172. The common electrode 173 may be a common layer commonly formed in the first light emitting portion EA1 and the second light emitting portion EA2.

In the top emission structure, the common electrode 173 may be formed of a transparent conductive material (TCO) such as ITO or indium zinc oxide (IZO) capable of transmitting light, or a semi-transmissive conductive material such as magnesium (Mg), silver (Ag), or an alloy of magnesium (Mg) and silver (Ag). When the common electrode 173 is formed of the semi-transmissive conductive material, light emitting efficiency may be increased by a micro cavity.

A spacer 191 may be arranged on the bank 190. The spacer 191 may serve to support a mask during a process of fabricating the light emitting layer 172. The spacer 191 may be formed as an organic film made of an acryl resin, an epoxy resin, a phenolic resin, a polyamide resin, a polyimide resin, and/or the like.

In one or more embodiments, the display panel 400 may further include a capping layer CPL arranged on the common electrode 173. The capping layer CPL may include an inorganic material. For example, the capping layer CPL may include at least one of silicon nitride, aluminum nitride, zirconium nitride, titanium nitride, hafnium nitride, tantalum nitride, silicon oxide, aluminum oxide, titanium oxide, tin oxide, cerium oxide, and/or silicon oxynitride.

An encapsulation layer TFEL may be arranged on the common electrode 173. The encapsulation layer TFEL may include at least one inorganic film to prevent or reduce oxygen or moisture from permeating into the light emitting element layer EML. In some embodiments, the encapsulation layer TFEL may include at least one organic film to protect the light emitting element layer EML from foreign substances such as dust. For example, the encapsulation layer TFEL may include a first encapsulation inorganic film TFE1, an encapsulation organic film TFE2, and a second encapsulation inorganic film TFE3.

The first encapsulation inorganic film TFE1 may be arranged on the common electrode 173, the encapsulation organic film TFE2 may be arranged on the first encapsulation inorganic film TFE1, and the second encapsulation inorganic film TFE3 may be arranged on the encapsulation organic film TFE2. The first encapsulation inorganic film TFE1 and the second encapsulation inorganic film TFE3 may be formed as a multi-film in which one or more inorganic films of a silicon nitride layer, a silicon oxynitride layer, a silicon oxide layer, a titanium oxide layer, and an aluminum oxide layer are alternately stacked. The encapsulation organic film TFE2 may be an organic film made of an acrylic resin, an epoxy resin, a phenolic resin, a polyamide resin, or a polyimide resin.

The touch sensing layer TDL may be arranged on the encapsulation layer TFEL. The touch sensing layer TDL includes a first touch insulating film TINS1, a connection electrode BE, a second touch insulating film TINS2, a driving electrode TE, a sensing electrode RE, and a third touch insulating film TINS3.

The first touch insulating layer TINS1 may be arranged on the encapsulation layer TFEL. The first touch insulating film TINS1 may be formed as an inorganic film, for example, a silicon nitride layer, a silicon oxynitride layer, a silicon oxide layer, a titanium oxide layer, or an aluminum oxide layer.

The connection electrodes BE may be arranged on the first touch insulating film TINS1. The connection electrode BE may be formed as a single layer or a multi-layer made of any one of molybdenum (Mo), aluminum (Al), chromium (Cr), gold (Au), titanium (Ti), nickel (Ni), neodymium (Nd), and/or copper (Cu), and/or an alloy thereof.

The second touch insulating film TINS2 may be arranged on the connection electrode BE. The second touch insulating film TINS2 may be formed as an inorganic film, for example, a silicon nitride layer, a silicon oxynitride layer, a silicon oxide layer, a titanium oxide layer, or an aluminum oxide layer. In one or more embodiments, the second touch insulating film TINS2 may be formed as an organic film made of an acryl resin, an epoxy resin, a phenolic resin, a polyamide resin, a polyimide resin, and/or the like.

The driving electrodes TE and the sensing electrodes RE may be arranged on the second touch insulating film TINS2. The driving electrodes TE and the sensing electrodes RE may be formed as a single layer or a multi-layer made of any one of molybdenum (Mo), aluminum (Al), chromium (Cr), gold (Au), titanium (Ti), nickel (Ni), neodymium (Nd), and/or copper (Cu), and/or one or more alloys thereof.

The driving electrode TE and the sensing electrode RE may overlap the connection electrode BE in the third direction DR3. The driving electrode TE may be connected to the connection electrode BE through a touch contact hole TCNT1 penetrating through the first touch insulating film TINS1.

The third touch insulating film TINS3 may be formed on the driving electrodes TE and the sensing electrodes RE. The third touch insulating film TINS3 may serve to planarize a step (e.g., act or task) formed due to the driving electrodes TE, the sensing electrodes RE, and the connection electrodes BE. The third touch insulating film TINS3 may be formed as an organic film made of an acryl resin, an epoxy resin, a phenolic resin, a polyamide resin, a polyimide resin, and/or the like.

Figure 7:
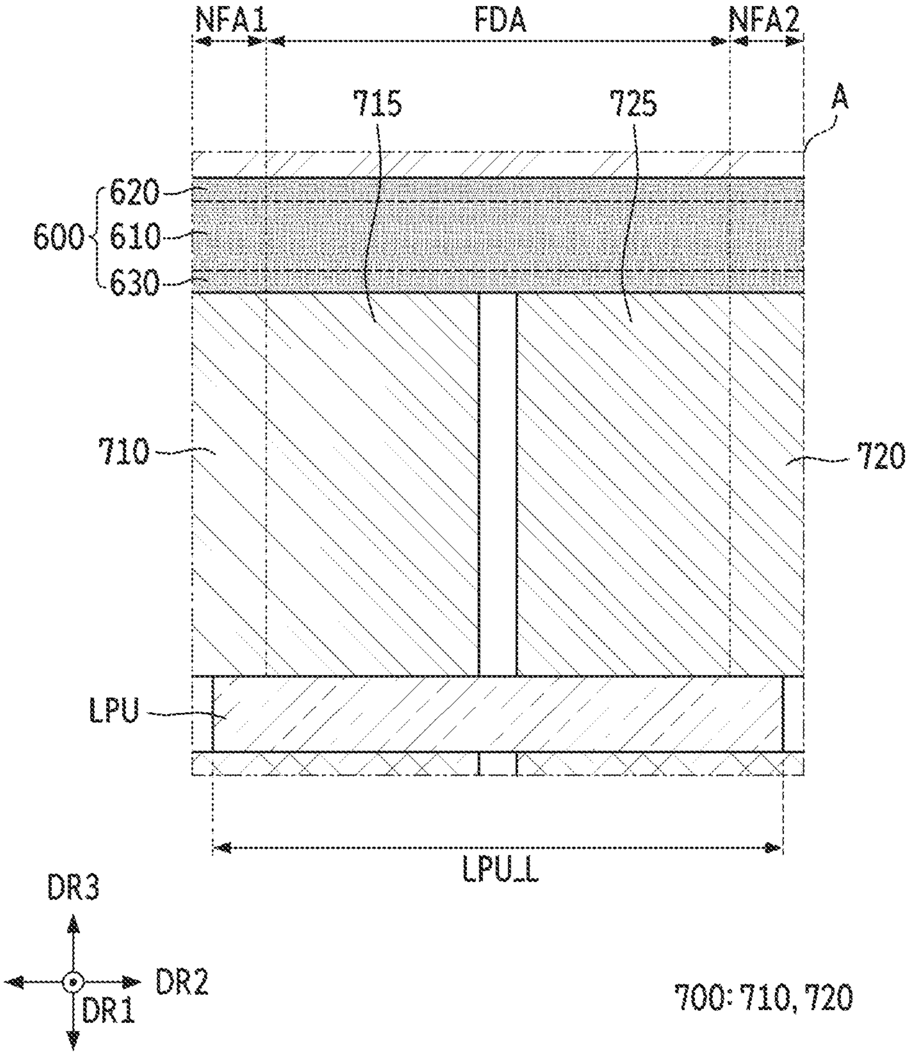
FIG. 7 is an enlarged view of area A of FIG. 5.
Figure 8:
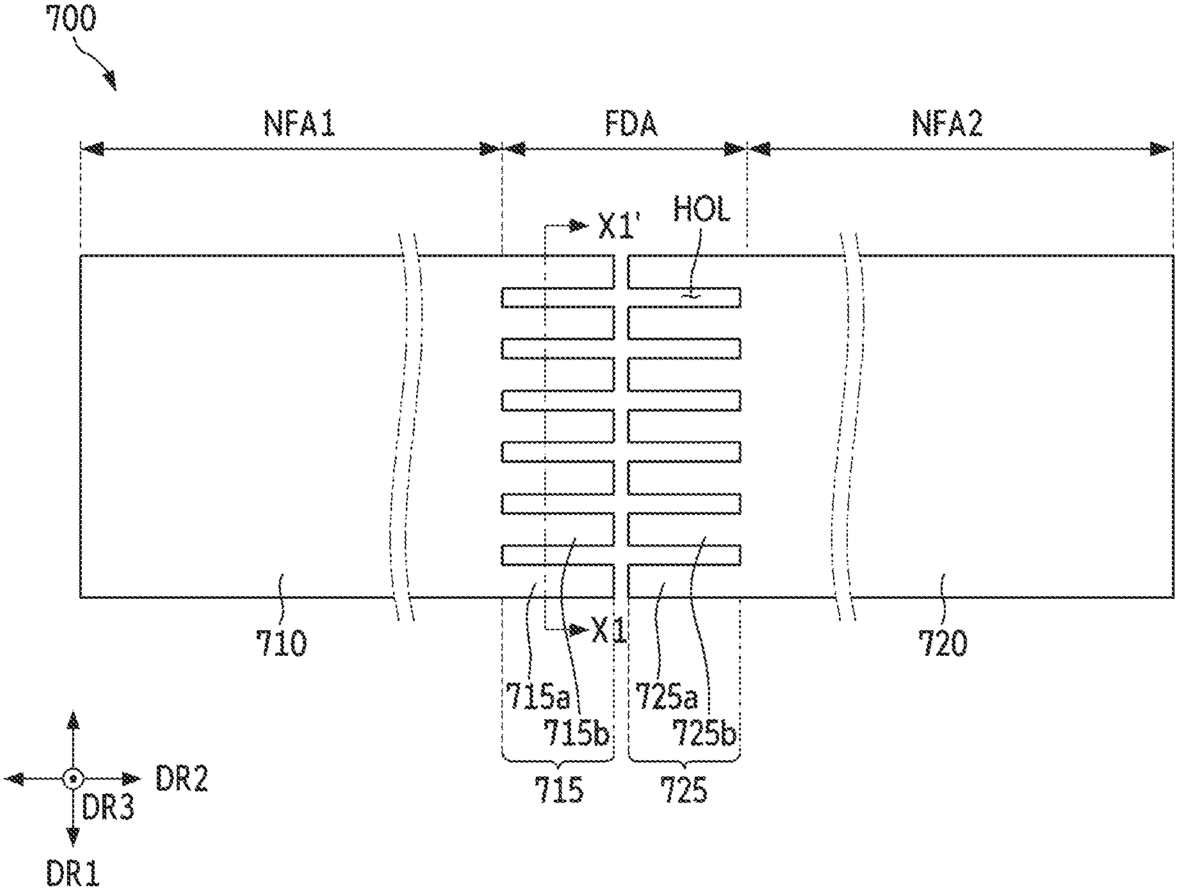
FIG. 8 is a plan view illustrating a panel support member according to one or more embodiments.
Figure 9:
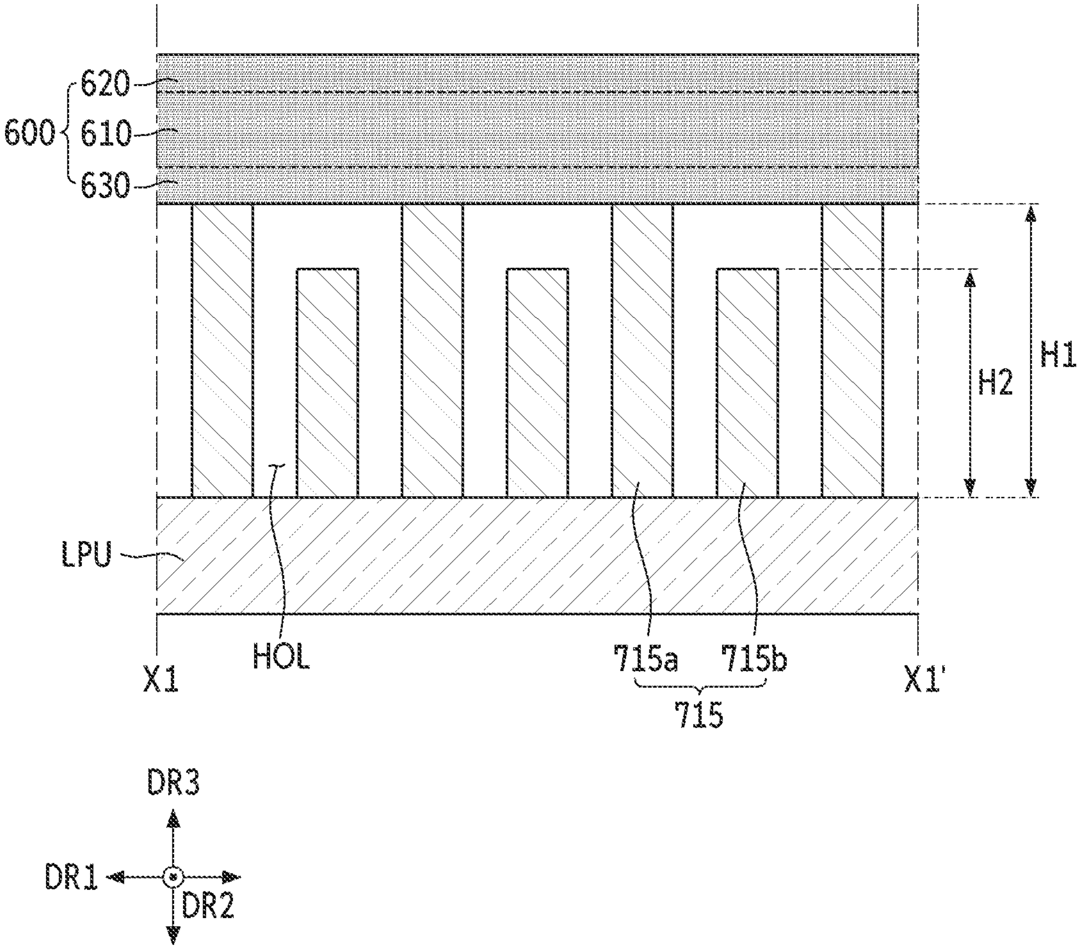
FIG. 9 is a cross-sectional view taken along the line X1-X1' of FIG. 8.

FIG. 7 is an enlarged view of area A of FIG. 5. FIG. 8 is a plan view illustrating a panel support member according to one or more embodiments. FIG. 9 is a cross-sectional view taken along the line X1-X1' of FIG. 8. FIG. 7 is a view viewed from the first direction DR1, FIG. 8 is a view viewed from the third direction DR3, and FIG. 9 is a view viewed from the second direction DR2.

Referring to FIGS. 7 to 9 in addition to FIG. 5, the barrier film 600 may include a support layer 610, a first adhesive layer 620, and a second adhesive layer 630.

The support layer 610 may enhance impact resistance of the display device 10. The support layer 610 may include polyethylene terephthalate (PET) or polyimide.

The first adhesive layer 620 may be arranged on an upper surface of the support layer 610. The second adhesive layer 630 may be arranged on a lower surface of the support layer 610. The first adhesive layer 620 and the second adhesive layer 630 may include a transparent adhesive such as a pressure sensitive adhesive (PSA) or an optically clear adhesive (OCA). The first adhesive layer 620 and the second adhesive layer 630 may include an acrylic adhesive material.

In the display device 10 according to the present embodiment, the support layer 610, the first adhesive layer 620, and the second adhesive layer 630 may be arranged across the folding area FDA and the non-folding areas NFA1 and NFA2. For example, the support layer 610, the first adhesive layer 620, and the second adhesive layer 630 may be connected without cutting from the folding area FDA to the non-folding areas NFA1 and NFA2. Accordingly, as will be described in more detail later, even if the panel support member 700 includes a differential pattern in the folding area FDA, the impact resistance of the display device 10 may be enhanced in the folding area FDA. In some embodiments, it is possible to prevent or reduce the differential pattern of the panel support member 700 from being visually recognized from the upper portion of the display device 10.

The panel support member 700 may include a first support 710 and a second support 720. The first support 710 may be arranged in the first non-folding area NFA1 and the folding area FDA, and the second support 720 may be arranged in the second non-folding area NFA2 and the folding area FDA. The first support 710 and the second support 720 may be spaced and/or apart (e.g., spaced apart or separated) from each other in the second direction DR2.

The first support 710 and the second support 720 may each include a differential pattern. For example, the first support 710 may include a first differential pattern 715 and the second support 720 may include a second differential pattern 725. The first differential pattern 715 and the second differential pattern 725 may each be arranged in the folding area FDA. The first differential pattern 715 and the second differential pattern 725 may be portions that are folded if (e.g., when) the display device 10 is folded.

A portion (e.g., a first body) of the first support 710 excluding the first differential pattern 715 and a portion (e.g., a second body) of the second support 720 excluding the second differential pattern 725 may be portions that are folded if (e.g., when) the display device 10 is folded. The first differential pattern 715 may protrude from the first body in the second direction DR2, and the second differential pattern 725 may protrude from the second body in a direction opposite to the second direction DR2. The first differential pattern 715 and the second differential pattern 725 may face each other in the second direction DR2. For example, when the display device 10 is folded, portions of the first support 710 excluding the first differential pattern 715 and portions of the second support 720 excluding the second differential pattern 725 may be folded. The first differential pattern 715 may protrude from the first support 710 in the second direction DR2, while the second differential pattern 725 may protrude from the second support 720 in the opposite direction. These differential patterns may face each other in the second direction DR2.

The first differential pattern 715 and the second differential pattern 725 may include first spacers 715*a* and 725*a* and second spacers 715*b* and 725*b*, respectively. The first spacers 715*a* and 725*a* and the second spacers 715*b* and 725*b* may have different heights. For example, a height H1 of the first spacers 715*a* and 725*a* may be higher than a height H2 of the second spacers 715*b* and 725*b*. Different heights of the first spacers 715*a* and 725*a* and the second spacers 715*b* and 725*b* may be formed through a half etching method or a photolithography method.

The first spacers 715*a* and 725*a* and the second spacers 715*b* and 725*b* may extend in the second direction DR2 and the third direction DR3. For example, the first spacers 715*a* and 725*a* and the second spacers 715*b* and 725*b* may have a shape (e.g., a rectangular parallelepiped shape) that protrudes from the first and second bodies in the second direction DR2 (or the direction opposite to the second direction DR2) and has a height in the third direction DR3.

In one or more embodiments, the first spacers 715*a* and 725*a* and the second spacers 715*b* and 725*b* may be alternately arranged in the first direction DR1. The first spacers 715*a* and 725*a* and the second spacers 715*b* and 725*b* may be spaced and/or apart (e.g., spaced apart or separated) from each (one) other in the first direction DR1. A hole HOL may be arranged between the first spacers 715*a* and 725*a* and the second spacers 715*b* and 725*b* that are spaced and/or apart (e.g., spaced apart or separated) from each other. As the first spacers 715*a* and 725*a* and the second spacers 715*b* and 725*b* are spaced and/or apart (e.g., spaced apart or separated) from each other, stress applied if (e.g., when) the display device 10 is folded may be minimized or reduced.

However, the arrangement of the first spacers 715*a* and 725*a* and the second spacers 715*b* and 725*b* is not limited thereto, and may be irregular. For example, the first spacers 715*a* and 725*a* may be arranged twice, then the second spacers 715*b* and 725*b* may be arranged once, the first spacers 715*a* and 725*a* may be arranged once again, and the second spacers 715*b* and 725*b* may be arranged once. For example, each of the first differential pattern 715 and the second differential pattern 725 may include at least one first spacer 715*a* and 725*a* and at least one second spacer 715*b* and 725*b*. In this case, the number or arrangement order of the first spacers 715*a* and 725*a* and the second spacers 715*b* and 725*b* are not limited.

In some embodiments, it is illustrated in FIG. 8 that the hole HOL of the first support 710 and the hole HOL of the second support 720 are arranged side by side in the second direction DR2, but the present disclosure is not limited thereto. For example, the hole HOL of the first support 710 may also be arranged side by side with the first spacers 715*a* and 725*a* and the second spacers 715*b* and 725*b* of the second support 720 in the second direction DR2.

As illustrated in FIG. 9, upper surfaces of the first spacers 715*a* and 725*a* may be in direct contact with the lower surfaces of the barrier film 600 (e.g., the second adhesive layer 630), and lower surfaces of the first spacers 715*a* and 725*a* may be in direct contact with the upper surface of the lower visibility prevention member LPU. Upper surfaces of the second spacers 715*b* and 725*b* may be spaced and/or apart (e.g., spaced apart or separated) from the lower surface of the barrier film 600 (e.g., the second adhesive layer 630), and lower surfaces of the second spacers 715*b* and 725*b* may be in direct contact with the upper surface of the lower visibility prevention member LPU. In one or more embodiments, the upper surfaces of the second spacers 715*b* and 725*b* may be in direct contact with the lower surface of the barrier film 600 (e.g., the second adhesive layer 630), and the lower surfaces of the second spacers 715*b* and 725*b* may be spaced and/or apart (e.g., spaced apart or separated) from the upper surface of the lower visibility prevention member LPU.

In one or more embodiments, a width LPU_L of the lower visibility prevention member LPU may be greater than a width of the differential pattern in the second direction DR2. For example, the width LPU_L of the lower visibility prevention member LPU may be greater than a width of the folding area FDA in the second direction DR2. The lower visibility prevention member LPU may be arranged not only in the folding area FDA but also in the non-folding areas NFA1 and NFA2.

In the display device 10 according to the present embodiment, as each of the first differential pattern 715 and the second differential pattern 725 includes the first spacers 715*a* and 725*a* and the second spacers 715*b* and 725*b* having different heights, the impact resistance of the display device 10 may be enhanced. For example, as described herein, because the support layer 610 and the adhesive layers 620 and 630 of the barrier film 600 are arranged across the folding area FDA and the non-folding areas NFA1 and NFA2, the impact resistance of the display device 10 may be enhanced. In one or more embodiments, if (e.g., when) an impact is applied to the upper portion of the display device 10, a portion of the barrier film 600 may be supported by the first spacers 715*a* and 725*a* to disperse the impact, and another portion of the barrier film 600 may further disperse the impact by an air gap between the second spacers 715*b* and 725*b* and the barrier film 600. In some embodiments, because air may freely circulate through the hole (opening) HOL between the first spacers 715*a* and 725*a* and the second spacers 715*b* and 725*b*, a buffering effect of the air gap may be further improved.

Hereinafter, one or more embodiments of the display device according to one or more embodiments will be described. In the following embodiments, the same components as those of the herein-described embodiment will be denoted by the same reference numerals, and an overlapping description thereof will not be provided or simplified and differences will be mainly described.

Figure 10:
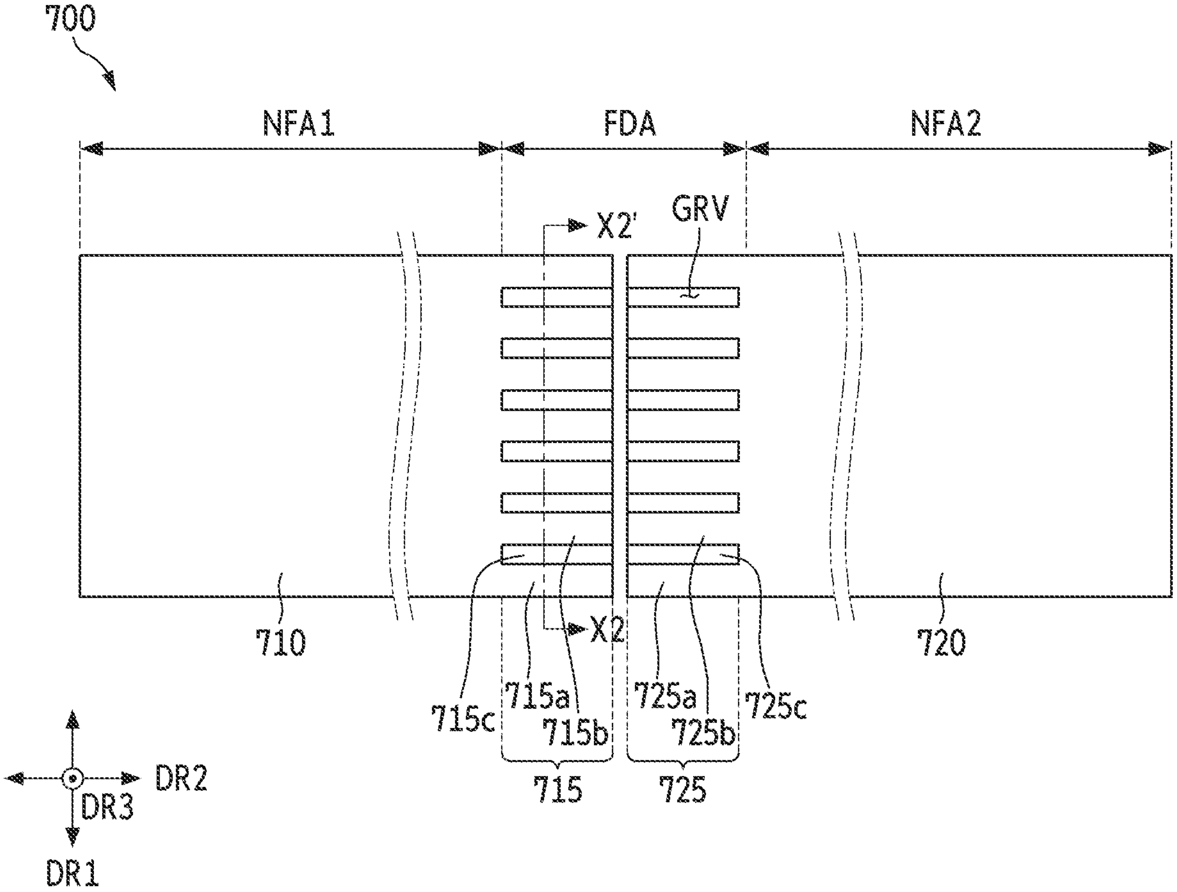
FIG. 10 is a plan view illustrating a panel support member according to one or more embodiments.
Figure 11:
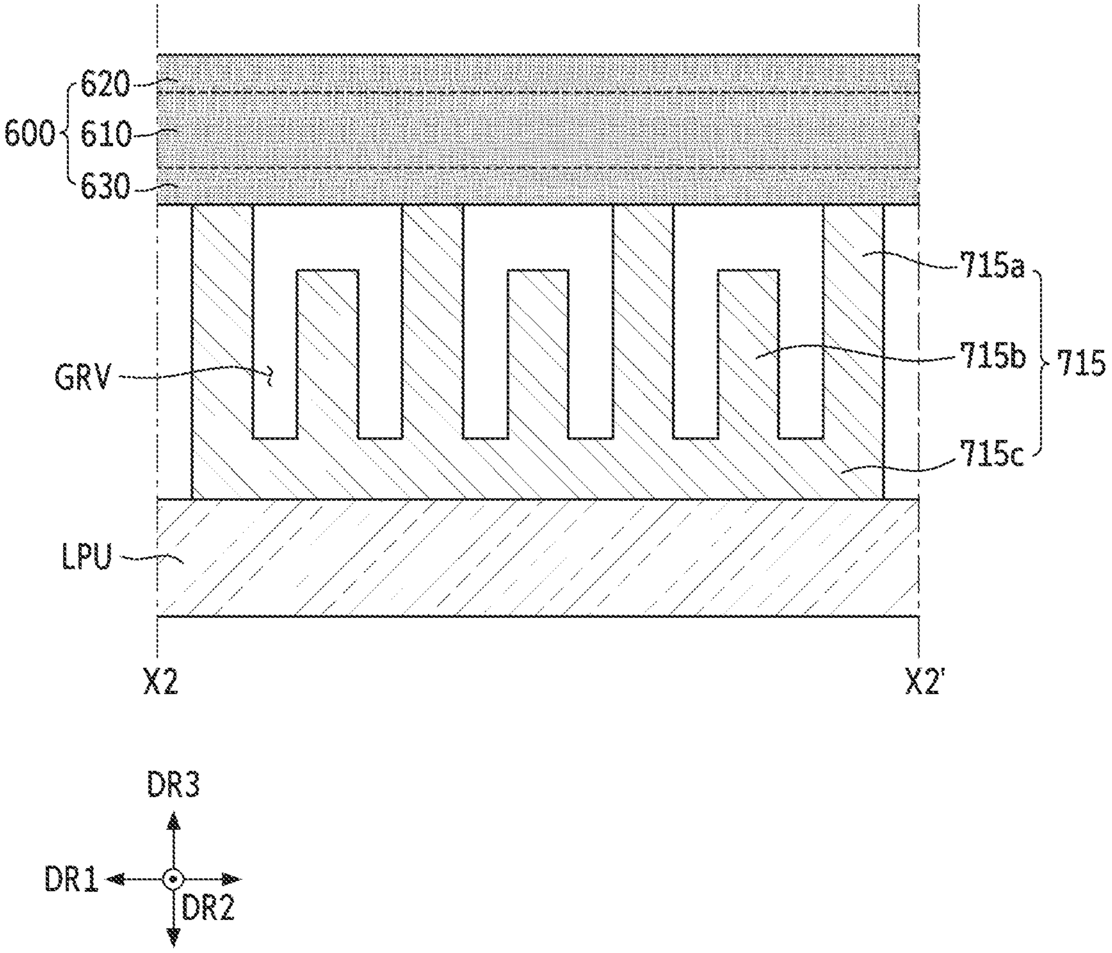
FIG. 11 is a cross-sectional view taken along the line X2-X2' of FIG. 10.

FIG. 10 is a plan view illustrating a panel support member according to one or more embodiments. FIG. 11 is a cross-sectional view taken along the line X2-X2' of FIG. 10. FIG. 10 is a view viewed from the third direction DR3, and FIG. 11 is a view viewed from the second direction DR2.

Referring to FIGS. 10 and 11, a display device 10 according to the present embodiment is different from the display device 10 according to one or more embodiments described with reference to FIG. 7 and/or the like in that the display device 10 further includes bottom portions 715*c* and 725*c* and includes a groove GRV instead of the hole HOL.

For example, the first differential pattern 715 and the second differential pattern 725 may further include bottom portions 715*c* and 725*c*, respectively. The bottom portions 715*c* and 725*c* may support the first spacers 715*a* and 725*a* and the second spacers 715*b* and 725*b*. For example, the bottom portions 715*c* and 725*c* may be arranged on upper or lower portions of the first spacers 715*a* and 725*a* and the second spacers 715*b* and 725*b*. For example, the bottom portions 715*c* and 725*c* may be arranged between the first spacers 715*a* and 725*a* and the second spacers 715*b* and 725*b* and the barrier film 600 in the third direction DR3, or may be arranged between the first spacers 715*a* and 725*a* and the second spacers 715*b* and 725*b* and the lower visibility prevention member LPU in the third direction DR3. In one or more embodiments, the bottom portions 715*c* and 725*c* may be an integrated configuration physically connected to the first spacers 715*a* and 725*a* and the second spacers 715*b* and 725*b*.

As the bottom portions 715*c* and 725*c* are arranged, a groove GRV instead of the hole HOL may be arranged between the first spacers 715*a* and 725*a* and the second spacers 715*b* and 725*b* that are spaced and/or apart (e.g., spaced apart or separated) from each other.

As the display device 10 according to the present embodiment includes the bottom portions 715*c* and 725*c* that support the first spacers 715*a* and 725*a* and the second spacers 715*b* and 725*b*, durability of the first differential pattern 715 and the second differential pattern 725 may be improved.

Figure 12:
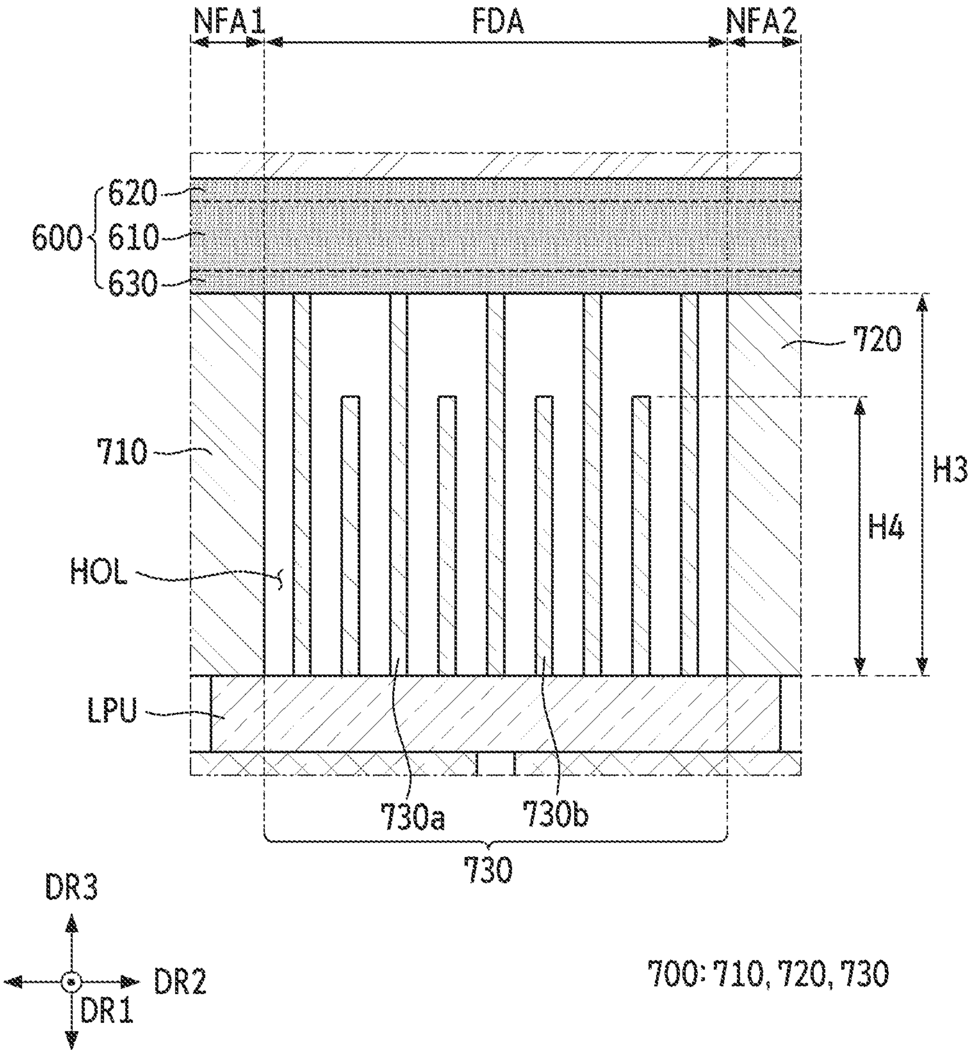
FIG. 12 is a cross-sectional view illustrating a portion of a display device according to still one or more embodiments.
Figure 13:
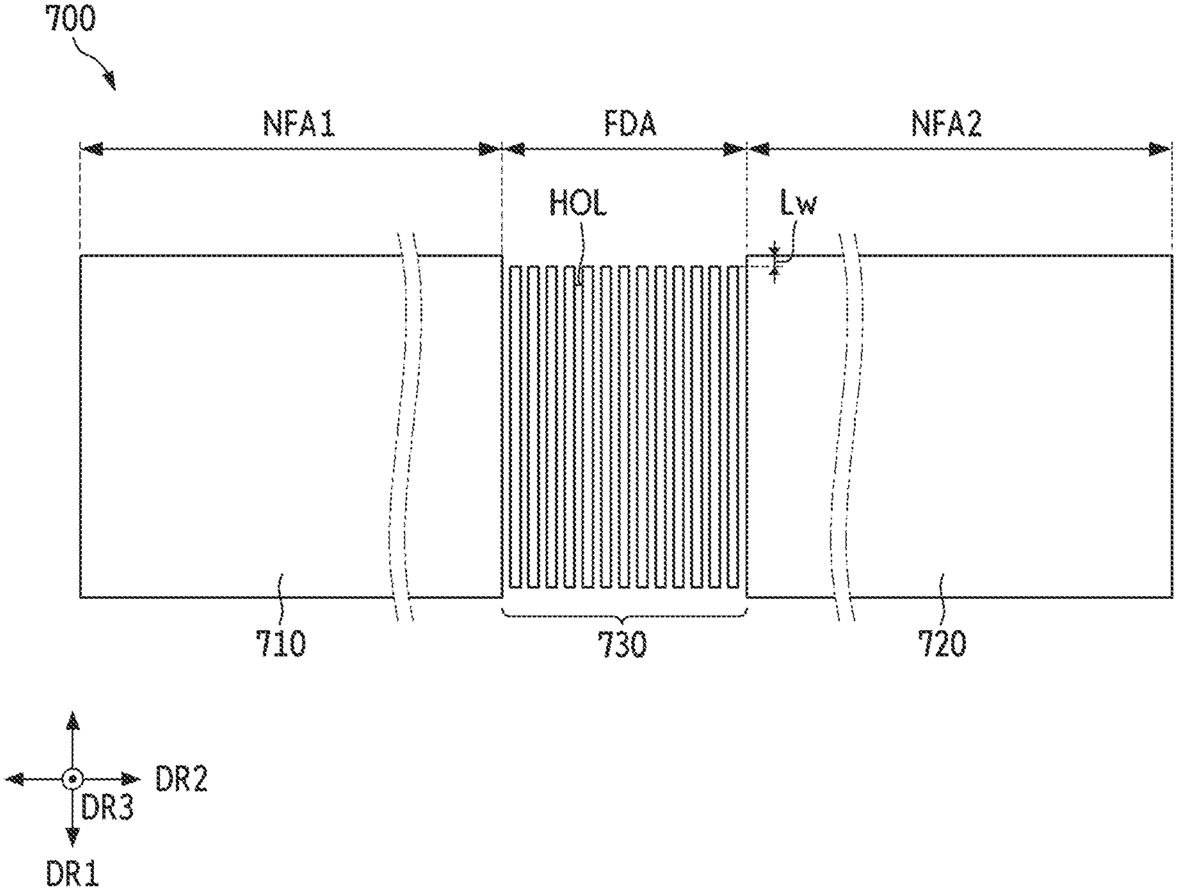
FIG. 13 is a plan view illustrating a panel support member according to one or more embodiments of FIG. 12.

FIG. 12 is a cross-sectional view illustrating a portion of a display device according to still one or more embodiments. FIG. 13 is a plan view illustrating a panel support member according to one or more embodiments of FIG. 12. FIG. 12 is a view viewed from the first direction DR1, and FIG. 13 is a view viewed from the third direction DR3.

Referring to FIGS. 12 and 13, a display device 10 according to the present embodiment is different from the display device 10 according to one or more embodiments described herein with reference to FIGS. 7 and 10 and/or the like, which includes a differential pattern of a horizontal pattern, in that the differential pattern 730 is a vertical pattern.

For example, the panel support member 700 of the display device 10 according to the present embodiment may include a first support 710, a second support 720, and a differential pattern 730. The first support 710 may be arranged in the first non-folding area NFA1, the second support 720 may be arranged in the second non-folding area NFA2, and the differential pattern 730 may be arranged in the folding area FDA. The first support 710, the second support 720, and the differential pattern 730 may be spaced and/or apart (e.g., spaced apart or separated) from each other in the second direction DR2.

The first support 710 and the second support 720 may be portions that are not folded if (e.g., when) the display device 10 is folded. The first support 710 and the second support 720 may have a plate shape (e.g., in a form of plates). For example, the first support 710 and the second support 720 may have a quadrangular shape, as illustrated in FIG. 13.

The differential pattern 730 may be a portion that is folded if (e.g., when) the display device 10 is folded. The differential pattern 730 may include a plurality of bars. The plurality of bars of the differential pattern 730 may extend in the first direction DR1 and the third direction DR3, respectively. The plurality of bars of the differential pattern 730 may have a shape (e.g., a rectangular parallelepiped shape) that extends in the first direction DR1 and has a height in the third direction DR3.

The plurality of bars of the differential pattern 730 may be arranged to be spaced and/or apart (e.g., spaced apart or separated) from each other in the second direction DR2. A hole (opening) HOL may be arranged between the plurality of bars of the differential pattern 730. When the display device 10 is folded, a separation distance between the plurality of bars increases, so that the differential pattern 730 may be stretched in the second direction DR2 to minimize or reduce folding stress.

The plurality of bars of the differential pattern 730 may include a first spacer 730*a* and a second spacer 730*b*. The first spacer 730*a* and the second spacer 730*b* may be alternately arranged in the second direction DR2. The first spacer 730*a* and the second spacer 730*b* may have different heights. For example, a height H3 of the first spacer 730*a* may be higher than a height H4 of the second spacer 730*b*. Different heights of the first spacer 730*a* and the second spacer 730*b* may be formed through a half etching method or a photolithography method.

The plurality of bars of the differential pattern 730 may be formed by patterning the panel support member 700. For example, the plurality of bars of the differential pattern 730 may be formed by etching a portion of the panel support member 700. Before forming the plurality of bars of the differential pattern 730, the first support 710, the second support 720, and the differential pattern 730 may be an integrated configuration. The first spacer 730*a*, the second spacer 730*b*, and the hole HOL may be formed in the differential pattern 730 through half-etching or photolithography. In this case, although not illustrated in the drawing, bridges connecting the first support 710 and the second support 720 in the second direction DR2 may be arranged at both (e.g., simultaneously) ends of the differential pattern 730 in the first direction DR1. Because the plurality of bars is connected to the bridge, the first support 710, the second support 720, and the plurality of bars of the differential pattern 730 may function (e.g., be treated) as one piece while being connected to each other. In this state, positions of the plurality of bars and the holes HOL may be fixed by disposing the panel support member 700 on the barrier film 600 or the lower visibility prevention member LPU having adhesiveness. Thereafter, the bridge may be removed, and the differential pattern 730 may maintain the shape illustrated in FIG. 13. Accordingly, one end of the differential pattern 730 in the first direction DR1 may be positioned inside one end of the first support 710 and/or the second support 720 in the first direction DR1 by a first width Lw. For example, one end of the first support 710 and/or the second support 720 in the first direction DR1 may protrude in the first direction DR1 by the first width Lw than one end of the differential pattern 730 in the first direction DR1. For example, the plurality of bars of the differential pattern 730 may be formed by etching a portion of the panel support member 700. Initially, the first support 710, the second support 720, and the differential pattern 730 may be integrated. The first spacer 730*a*, the second spacer 730*b*, and the hole HOL may be formed in the differential pattern 730 through half-etching or photolithography. Bridges connecting the first and second supports in the second direction DR2 may be arranged at both ends of the differential pattern 730 in the first direction DR1. Because the bars are connected to the bridge, the first support 710, the second support 720, and the bars of the differential pattern 730 may function as one piece. The positions of the bars and holes HOL may be fixed by placing the panel support member 700 on the barrier film 600 or the lower visibility prevention member LPU. After removing the bridge, the differential pattern 730 may maintain its shape as shown in FIG. 13. Accordingly, one end of the differential pattern 730 in the first direction DR1 may be positioned inside one end of the first support 710 and/or the second support 720 by a first width Lw. For example, one end of the first support 710 and/or the second support 720 may protrude in the first direction DR1 by the first width Lw more than one end of the differential pattern 730.

It is illustrated in the drawing that the first spacer 730*a* and the second spacer 730*b* are alternately arranged, but the present disclosure is not limited thereto. As in the display device 10 according to one or more embodiments described with reference to FIG. 7 and/or the like, the arrangement of the first spacers 715*a* and 725*a* and the second spacers 715*b* and 725*b* may be irregular. The number or arrangement order of the first spacers 715*a* and 725*a* and the second spacers 715*b* and 725*b* are not limited to those illustrated in the drawings.

As illustrated in FIG. 12, an upper surface of the first spacer 730*a* may be in direct contact with the lower surfaces of the barrier film 600 (e.g., the second adhesive layer 630), and a lower surface of the first spacer 730*a* may be in direct contact with the upper surface of the lower visibility prevention member LPU. An upper surface of the second spacer 730*b* may be spaced and/or apart (e.g., spaced apart or separated) from the lower surface of the barrier film 600 (e.g., the second adhesive layer 630), and a lower surface of the second spacer 730*b* may be in direct contact with the upper surface of the lower visibility prevention member LPU. In one or more embodiments, the upper surface of the second spacer 730*b* may be in direct contact with the lower surface of the barrier film 600 (e.g., the second adhesive layer 630), and the lower surface of the second spacer 730*b* may be spaced and/or apart (e.g., spaced apart or separated) from the upper surface of the lower visibility prevention member LPU.

In the display device 10 according to the present embodiment, as the differential pattern 730 includes the first spacer 730*a* and the second spacer 730*b* having different heights, impact resistance of the display device 10 may be enhanced. For example, as described herein, because the support layer 610 and the adhesive layers 620 and 630 of the barrier film 600 are arranged across the folding area FDA and the non-folding areas NFA1 and NFA2, the impact resistance of the display device 10 may be enhanced. In one or more embodiments, if (e.g., when) an impact is applied to the upper portion of the display device 10, a portion of the barrier film 600 may be supported by the first spacer 730*a* to disperse the impact, and another portion of the barrier film 600 may further disperse the impact by an air gap between the second spacer 730*b* and the barrier film 600. In some embodiments, because air may freely circulate through the hole HOL between the first spacer 730*a* and the second spacer 730*b*, a buffering effect of the air gap may be further improved.

In one or more embodiments, as the differential pattern 730 includes the hole HOL and the plurality of bars extending in the first direction DR1, that is, includes the vertical pattern, the display device 10 according to the present embodiment may further minimize or reduce folding stress.

Figure 14:
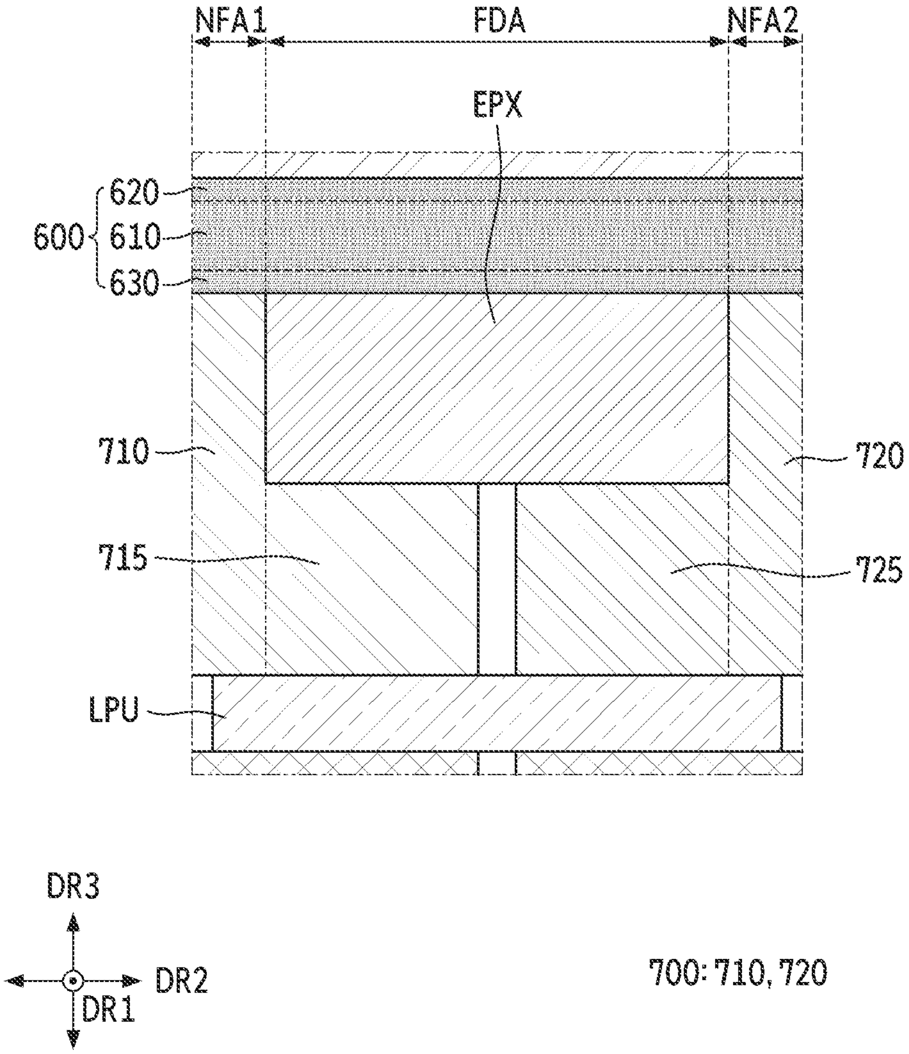
FIG. 14 is a cross-sectional view illustrating a portion of a display device according to still one or more embodiments.
Figure 15:
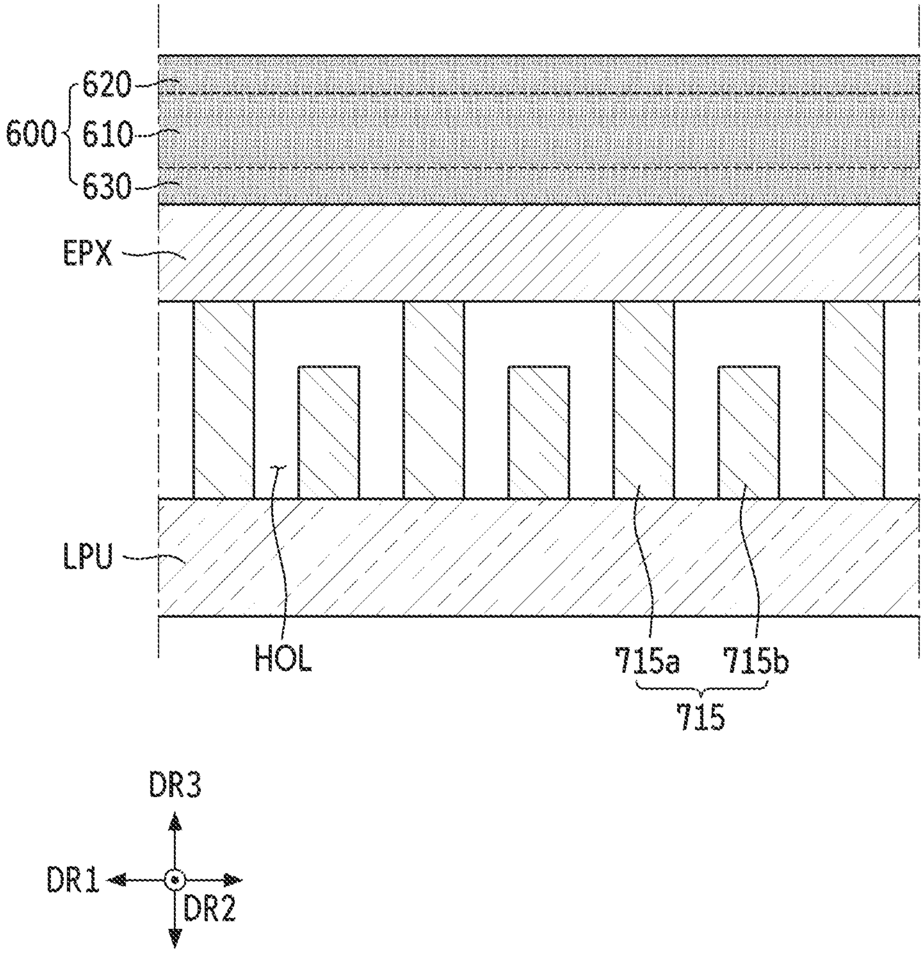
FIG. 15 is a cross-sectional view illustrating the display device according to one or more embodiments of FIG. 14.

FIG. 14 is a cross-sectional view illustrating a portion of a display device according to still one or more embodiments. FIG. 15 is a cross-sectional view illustrating the display device according to one or more embodiments of FIG. 14. FIG. 14 is a view viewed from the first direction DR1, and FIG. 15 is a view viewed from the second direction DR2.

Referring to FIGS. 14 and 15, a display device 10 according to the present embodiment is different from the display device 10 according to one or more embodiments described with reference to FIGS. 7, 10, 12, and/or the like in that it further includes a buffer layer EPX. Hereinafter, a case where the differential pattern is a horizontal pattern as an example, as in the display device 10 according to one or more embodiments described with reference to FIG. 7 and/or the like, but the following contents may also be equally applied to a case where the differential pattern is a vertical pattern, as in the display device 10 according to still one or more embodiments described with reference to FIG. 12 and/or the like.

For example, the display device 10 according to the present embodiment may further include a buffer layer EPX.

The buffer layer EPX may be arranged on the first differential pattern 715 and the second differential pattern 725. For example, the buffer layer EPX may be arranged between the first and second differential patterns 715 and 725 and the barrier film 600 in the third direction DR3.

The buffer layer EPX may be arranged between the first body of the first support 710 and the second body of the second support 720 in the second direction DR2. One side surface of the buffer layer EPX in the second direction DR2 may be in direct contact with one side surface of the first support 710 in the second direction DR2, and the other side surface of the buffer layer EPX in the second direction DR2 may be in direct contact with one side surface of the second support 720 in the second direction DR2.

The buffer layer EPX may be an elastomer having elasticity. For example, the buffer layer (EPX) may include, but is not limited to, an epoxy-based elastomer.

As illustrated in FIG. 15, the upper surface of the first spacer 715*a* may be in direct contact with a lower surface of the buffer layer EPX, and the lower surface of the first spacer 715*a* may be in direct contact with the upper surface of the lower visibility prevention member LPU. The upper surface of the second spacer 715*b* may be spaced and/or apart (e.g., spaced apart or separated) from the lower surface of the buffer layer EPX, and the lower surface of the second spacer 715*b* may be in direct contact with the upper surface of the lower visibility prevention member LPU. In one or more embodiments, the upper surface of the second spacer 715*b* may be in direct contact with the lower surface of the buffer layer EPX, and the lower surface of the second spacer 715*b* may be spaced and/or apart (e.g., spaced apart or separated) from the upper surface of the lower visibility prevention member LPU.

As the display device 10 according to the present embodiment further includes the buffer layer EPX, the impact resistance of the display device 10 and the durability of the differential pattern may be improved.

Figure 16:
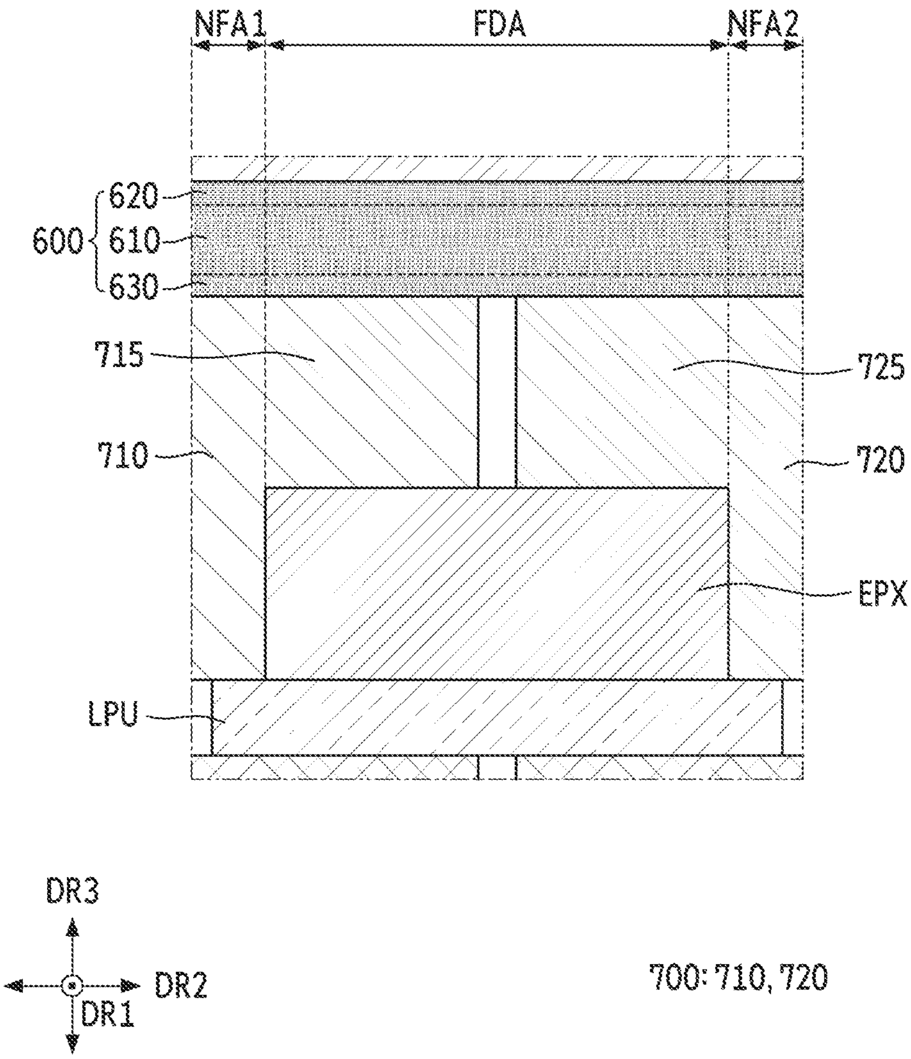
FIG. 16 is a cross-sectional view illustrating a portion of a display device according to still one or more embodiments.
Figure 17:
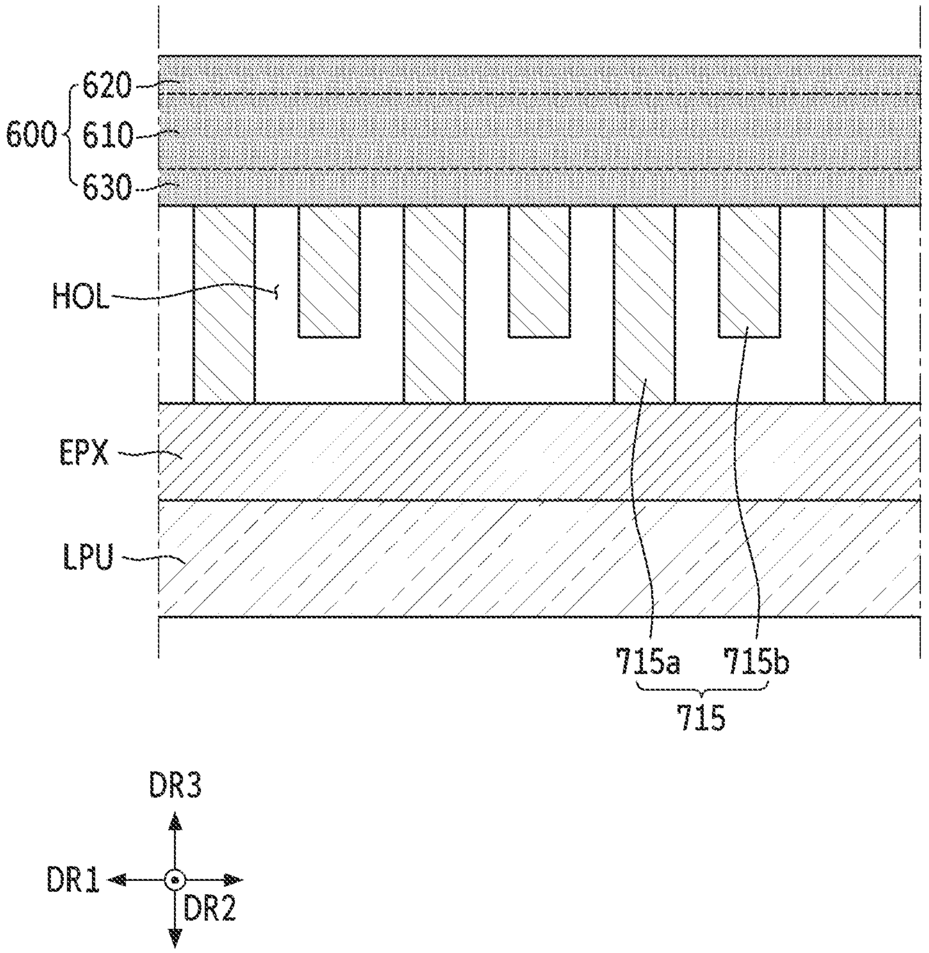
FIG. 17 is a cross-sectional view illustrating the display device according to one or more embodiments of FIG. 16.

FIG. 16 is a cross-sectional view illustrating a portion of a display device according to still one or more embodiments. FIG. 17 is a cross-sectional view illustrating the display device according to one or more embodiments of FIG. 16. FIG. 16 is a view viewed from the first direction DR1, and FIG. 17 is a view viewed from the second direction DR2.

Referring to FIGS. 16 and 17, a display device 10 according to the present embodiment is different from the display device 10 according to still one or more embodiments described with reference to FIG. 14 and/or the like in that the buffer layer EPX is arranged below the differential pattern. Hereinafter, a case where the differential pattern is a horizontal pattern as an example, as in the display device 10 according to one or more embodiments described with reference to FIG. 7 and/or the like, but the following contents may also be equally applied to a case where the differential pattern is a vertical pattern, as in the display device 10 according to still one or more embodiments described with reference to FIG. 12 and/or the like.

For example, the buffer layer EPX of the display device 10 according to the present embodiment may be arranged below the first differential pattern 715 and the second differential pattern 725. For example, the buffer layer EPX may be arranged between the first differential pattern 715 and the second differential pattern 725 and the lower visibility prevention member LPU in the third direction DR3.

As illustrated in FIG. 17, an upper surface of the first spacer 715*a* may be in direct contact with the lower surfaces of the barrier film 600 (e.g., the second adhesive layer 630), and a lower surface of the first spacer 715*a* may be in direct contact with the upper surface of the buffer layer EPX. An upper surface of the second spacer 715*b* may be in direct contact with the lower surface of the barrier film 600 (e.g., the second adhesive layer 630), and a lower surface of the second spacer 715*b* may be spaced and/or apart (e.g., spaced apart or separated) from the upper surface of the buffer layer EPX. In one or more embodiments, the upper surface of the second spacer 715*b* may be spaced and/or apart (e.g., spaced apart or separated) from the lower surface of the barrier film 600 (e.g., the second adhesive layer 630), and the lower surface of the second spacer 715*b* may be in direct contact with the upper surface of the buffer layer EPX.

As the display device 10 according to the present embodiment further includes the buffer layer EPX, the impact resistance of the display device 10 and the durability of the differential pattern may be improved.

Figure 18:
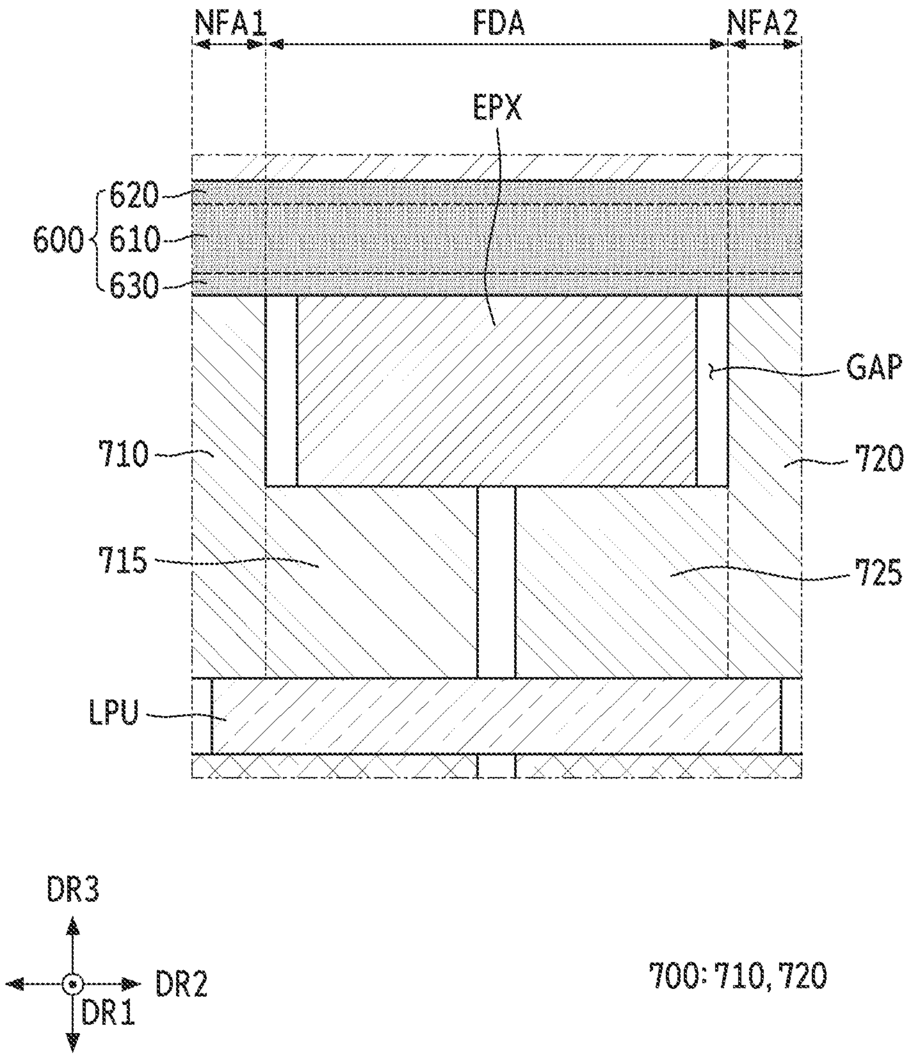
FIG. 18 is a cross-sectional view illustrating a portion of a display device according to still one or more embodiments.

FIG. 18 is a cross-sectional view illustrating a portion of a display device according to still one or more embodiments. FIG. 18 is a view viewed from the first direction DR1.

Referring to FIG. 18, a display device 10 according to the present embodiment is different from the display device 10 according to one or more embodiments described herein with reference to FIGS. 14 and 16 and/or the like in that the buffer layer EPX and the first support 710 and the second support 720 are spaced and/or apart (e.g., spaced apart or separated) from each other.

For example, the buffer layer EPX of the display device 10 according to the present embodiment may be arranged between the first body of the first support 710 and the second body of the second support 720 in the second direction DR2.

A side surface of the buffer layer EPX may be arranged to be spaced and/or apart (e.g., spaced apart or separated) from at least one of a side surface of the first support 710 and a side surface of the second support 720. As an example, one side surface of the buffer layer EPX in the second direction DR2 may be arranged to be spaced and/or apart (e.g., spaced apart or separated) from one side surface of the first support 710 in the second direction DR2, and the other side surface of the buffer layer EPX in the second direction DR2 may be arranged to be spaced and/or apart (e.g., spaced apart or separated) from one side surface of the second support 720 in the second direction DR2.

As another example, one side surface of the buffer layer EPX in the second direction DR2 may be in direct contact with one side surface of the first support 710 in the second direction DR2, and the other side surface of the buffer layer EPX in the second direction DR2 may be arranged to be spaced and/or apart (e.g., spaced apart or separated) from one side surface of the second support 720 in the second direction DR2. As still another example, one side surface of the buffer layer EPX in the second direction DR2 may be arranged to be spaced and/or apart (e.g., spaced apart or separated) from one side surface of the first support 710 in the second direction DR2, and the other side surface of the buffer layer EPX in the second direction DR2 may be in direct contact with one side surface of the second support 720 in the second direction DR2.

The display device 10 according to the present embodiment may make it possible to secure an attachment tolerance equal to a distance between the buffer layer EPX and the first support 710 and the second support 720 if (e.g., when) the buffer layer EPX and the panel support member 700 are coupled.

Figure 19:
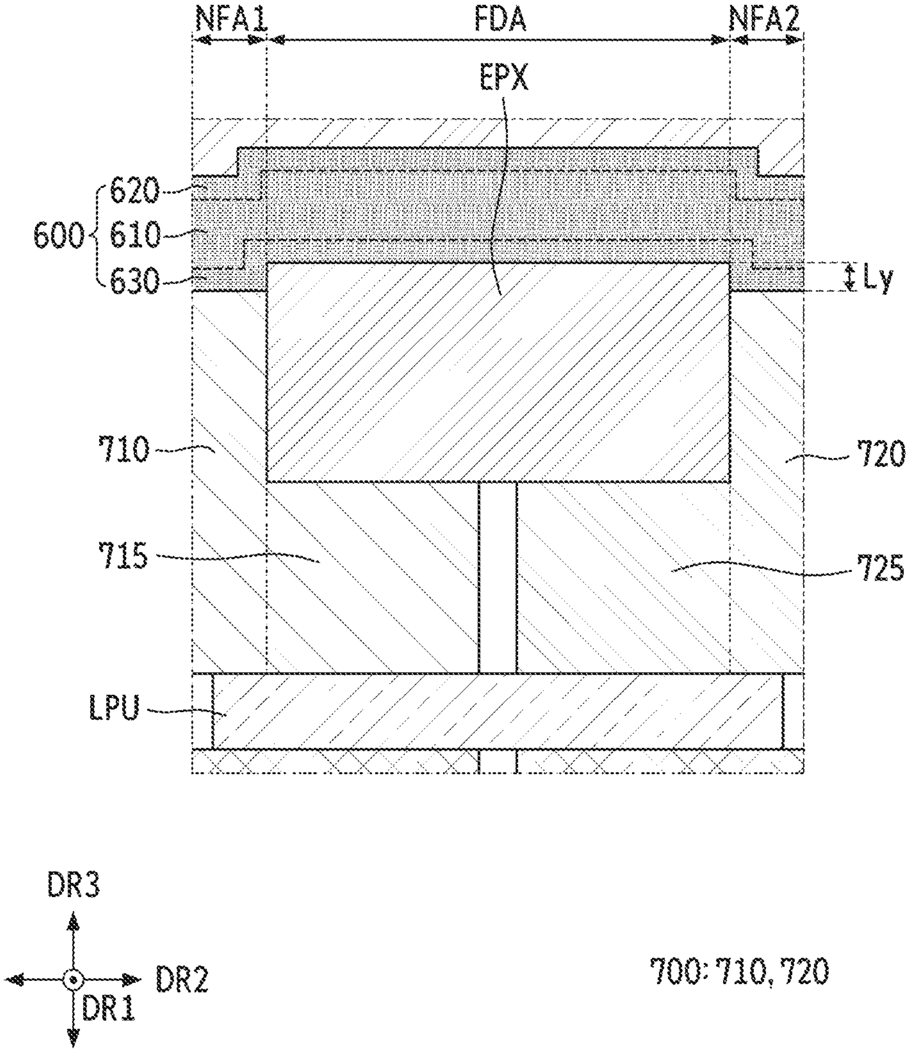
FIG. 19 is a cross-sectional view illustrating a portion of a display device according to still one or more embodiments.

FIG. 19 is a cross-sectional view illustrating a portion of a display device according to still one or more embodiments. FIG. 19 is a view viewed from the first direction DR1.

Referring to FIG. 19, a display device 10 according to the present embodiment is different from the display device 10 according to one or more embodiments described with reference to FIGS. 14, 16, 18, and/or the like in that the upper surface of the buffer layer EPX protrudes.

For example, the upper surface of the buffer layer EPX of the display device 10 according to the present embodiment may protrude further than the upper surfaces of the first support 710 and the second support 720. For example, the upper surface of the buffer layer EPX may protrude by a first height Ly than the upper surfaces of the first support 710 and the second support 720 in the third direction DR3, for example, in an upper direction.

The barrier film 600 may have a conformal shape along the upper surfaces of the first support 710, the buffer layer EPX, and the second support 720. For example, the barrier film 600 may have a shape that protrudes from the folding area FDA in the third direction DR3. The barrier film 600 may be in contact with not only the upper surface of the buffer layer EPX but also a portion of the side surface of the buffer layer EPX.

As a thickness of the buffer layer EPX of the display device 10 according to the present embodiment increases, a buffering effect may increase, and an occurrence of crease due to sagging of the upper member in the folding area FDA if (e.g., when) the display device 10 is folded may be minimized or reduced.

Figure 20:
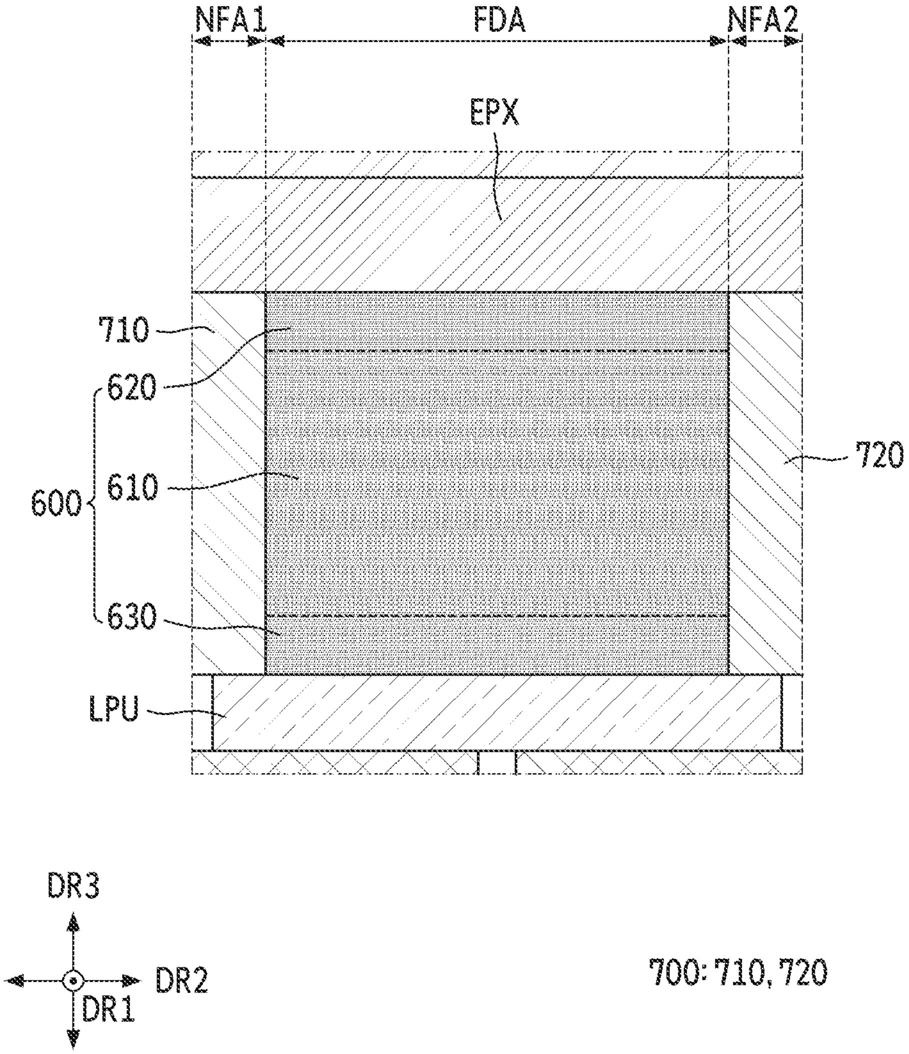
FIG. 20 is a cross-sectional view illustrating a portion of a display device according to still one or more embodiments.
Figure 21:
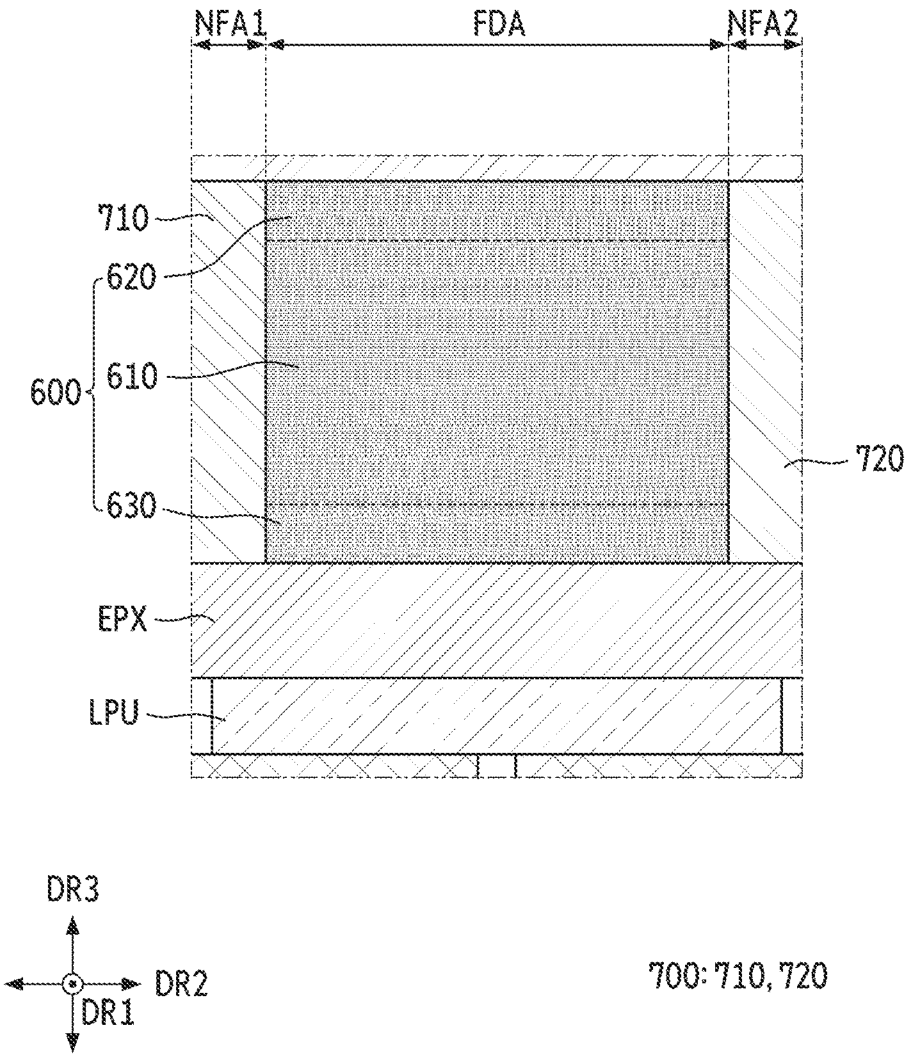
FIG. 21 is a cross-sectional view illustrating a portion of a display device according to still one or more embodiments.

FIG. 20 is a cross-sectional view illustrating a portion of a display device according to still one or more embodiments. FIG. 21 is a cross-sectional view illustrating a portion of a display device according to still one or more embodiments. FIGS. 20 and 21 are views viewed from the first direction DR1.

Referring to FIGS. 20 and 21, a display device 10 according to the present embodiment is different from the display device 10 according to one or more embodiments described with reference to FIGS. 7, 10, 12, 14, 16, 18, and 19 in that the positions of the buffer layer EPX and the barrier film 600 are different.

For example, the panel support member 700 may include a first support 710 and a second support 720. The panel support member 700 may not include (e.g., may exclude) a differential pattern between the first support 710 and the second support 720, unlike in the herein-described embodiments.

The barrier film 600 may be arranged between the first support 710 and the second support 720. For example, the barrier film 600 may be arranged between the first support 710 and the second support 720 in the second direction DR2. The barrier film 600 may be arranged in the folding area FDA.

The lower visibility prevention member LPU may be arranged below the panel support member 700. The upper surface of the lower visibility prevention member LPU may be in direct contact with the lower surface of the barrier film 600 (e.g., the lower surface of the second adhesive layer 630). The width LPU_L of the lower visibility prevention member LPU may be greater than a width of the barrier film 600 in the second direction DR2.

The buffer layer EPX may be arranged on the panel support member 700. In one or more embodiments, as illustrated in FIG. 20, the buffer layer EPX may be arranged on the panel support member 700. For example, the buffer layer EPX may be arranged on an upper surface of the panel support member 700. In one or more embodiments, as illustrated in FIG. 21, the buffer layer EPX may be arranged below the panel support member 700. For example, the buffer layer EPX may be arranged on a lower surface of the panel support member 700. The buffer layer EPX may be arranged across the folding area FDA and the non-folding areas NFA1 and NFA2.

The lower surface (or upper surface) of the buffer layer EPX may be in direct contact with (e.g., on) the upper surface (or lower surface) of the barrier film 600. Accordingly, the folding stress of the barrier film 600 in the folding area FDA may be minimized or reduced.

In the display device 10 according to the present embodiment, durability of the folding area FDA may be increased by disposing the barrier film 600 between the first support 710 and the second support 720 instead of the differential pattern, and the folding stress may be minimized or reduced and the impact resistance may be enhanced by disposing the buffer layer EPX on the panel support member 700.

In one or more embodiments, the display device may be a component of and/or applied to electronic devices such as smartphones, televisions, monitors, tablets, electric vehicles, mobile phones, tablet personal computers (PC), mobile communication terminals, electronic notebooks, electronic books, portable multimedia players (PMP), navigation devices, ultra-mobile personal computers (UMPC), laptop computers, billboards, Internet of Things (IoT) devices, smartwatches, watch phones, or head-mounted displays (HMD). For example, the display device DD may be applied to a display unit of a television, a laptop computer, a monitor, a billboard, or the Internet of Things (IoT). Alternatively, in one or more embodiments, the display device DD may be applied to a smartwatch, a watch phone, and/or a head-mounted display device (HMD) for implementing virtual reality and/or augmented reality.

The display device 10 according to the above-described embodiments of the present disclosure can be applied to various electronic devices. The electronic device according to the above-described embodiments of the present disclosure includes the display device 10 described above, and may further include modules or devices having additional functions in addition to the display device 10. In some embodiments, the electronic device may be a foldable display device.

Figure 22:
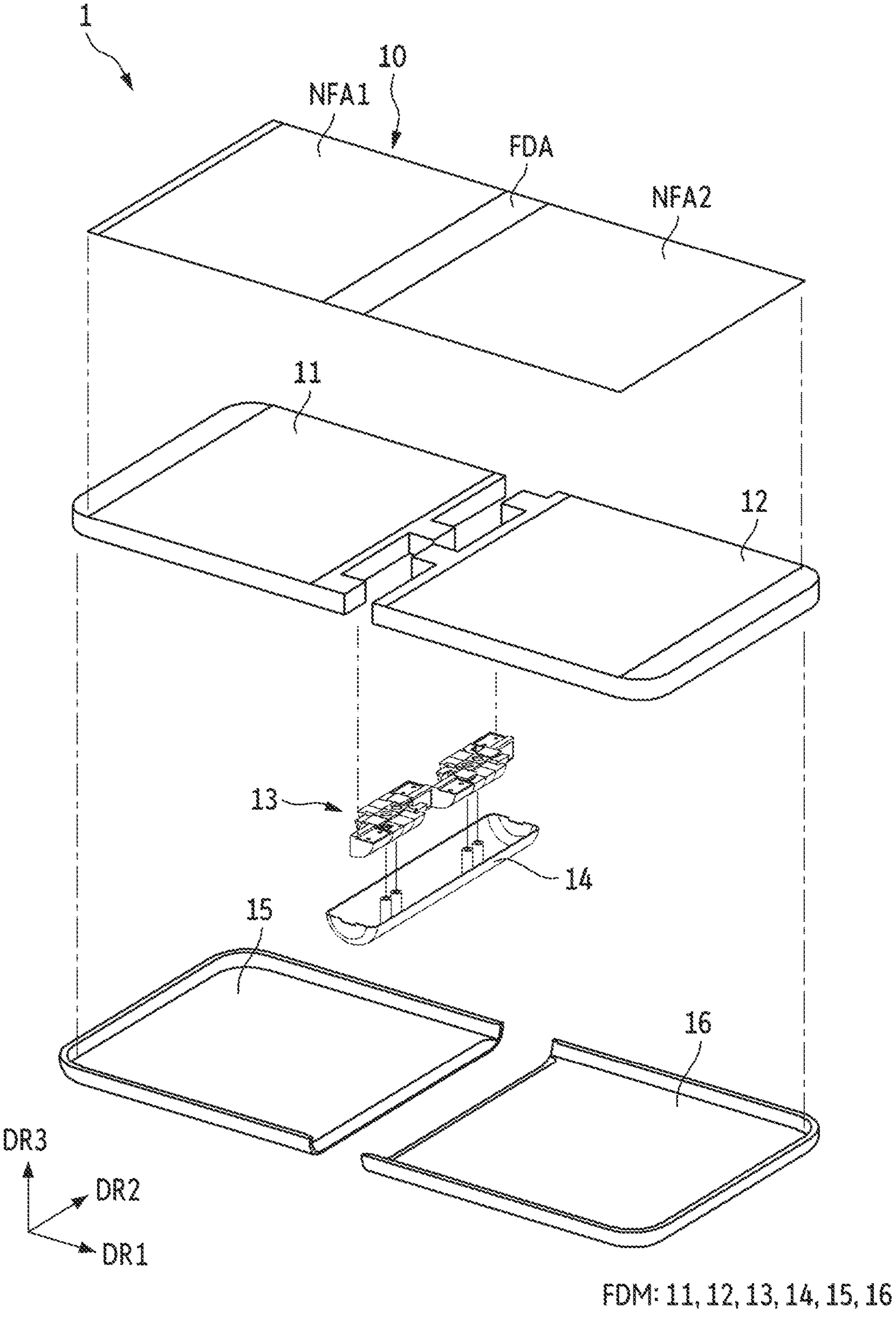
FIG. 22 is an exploded perspective view of the foldable display device according to one or more embodiments.

FIG. 22 is an exploded perspective view of the foldable display device according to one or more embodiments.

Referring to FIG. 22, the foldable display device 1 includes a display device 10 and a folding member FDM. The folding member FDM includes a first support member 11, a second support member 12, a hinge 13, a hinge cover 14, a first back cover 15, and a second back cover 16.

The first support member 11 and second support member 12 may be arranged in the first direction DR1. The display device 10 may be disposed on the first support member 11 and second support member 12 and the hinge 13.

One side of the first support member 11 and one side of the second support member 12 are disposed to face each other. The folding area FDA of the display device 10 is disposed on a coupling location between the first support member 11 and second support member 12, and the hinge 13. Each of the non-folding areas NFA1 and NFA2 of the display panel are disposed on the upper surfaces of each of the first support member 11 and second support member 12.

The hinge 13 is connected to one side of the first support member 11 and one side of the second support member 12, which face each other in the first direction DR1. The hinge 13 provides rotation axes to each of one side of the first support member 11 and one side of the second support member 12.

The first back cover 15 may be disposed on the back surface of the first support member 11 to cover the first support member 11. The first back cover 15 may be disposed to cover a part of the hinge cover 14 (for example, an upper-end portion of a lower surface of the hinge cover). The hinge cover 14 may be disposed between the first support member 11 and the second support member 12. The first back cover 15 may have rounded corners. The first back cover 15 may be empty inside or may form an empty space between the first back cover 15 and the first support member 11 while being fastened to the first support member 11. For example, the first back cover 15 may have a structure in which a rectangular bottom surface and three side walls extending from the bottom surface are formed. For example, one side of the first back cover 15 may be open without sidewalls.

The second back cover 16 may be disposed on the back surface of the second support member 12 to cover the second support member 12. The second back cover 16 may be disposed to cover other parts of the hinge cover 14 (for example, a lower end portion of the hinge cover), which may be partially covered by the second back cover 16. Similarly to the first back cover 15, the second back cover 16 may also have rounded corners. The second back cover 16 may be empty inside. The second back cover 16 may also form an empty space between the second back cover 16 and the second support member 12 while being engaged to the second support member 12. In this regard, the second back cover 16 may have a structure in which a rectangular bottom surface and three side walls extending from the bottom surface are formed. For example, one side of the second back cover 16 may be open without sidewalls.

The hinge 13 may be seated and fixed to the hinge cover 14. The hinge cover 14 may be covered by one side of the first back cover 15 and one side of the second back cover 16. Additionally, the hinge cover 14 may be exposed to the outside according to the folded state of the foldable display device 1. For example, when the foldable display device 1 is unfolded, the hinge cover 14 may be covered by the first back cover 15 and the second back cover 16. When the foldable display device 1 is folded, the hinge cover 14 may be disposed to be exposed to the outside from the sides of the first back cover 15 and the second back cover 16.

In concluding the detailed description, those skilled in the art will appreciate that many variations and modifications can be made to the one or more embodiments without substantially departing from the principles of the present disclosure. Therefore, the disclosed embodiments of the present disclosure are used in a generic and descriptive sense only and not for purposes of limitation.

Terms such as "substantially," "about," and "approximately" are used as relative terms and not as terms of degree, and are intended to account for the inherent deviations in measured or calculated values that would be recognized by those of ordinary skill in the art. They may be inclusive of the stated value and an acceptable range of deviation as determined by one of ordinary skill in the art, considering the limitations and error associated with measurement of that quantity. For example, "about" may refer to one or more standard deviations, or ±30%, 20%, 10%, 5% of the stated value.

Numerical ranges disclosed herein include and are intended to disclose all subsumed sub-ranges of the same numerical precision. For example, a range of "1.0 to 10.0" includes all subranges having a minimum value equal to or greater than 1.0 and a maximum value equal to or less than 10.0, such as, for example, 2.4 to 7.6. Applicant therefore reserves the right to amend this specification, including the claims, to expressly recite any sub-range subsumed within the ranges expressly recited herein.

The display device, a device of manufacturing thereof, and/or any other relevant devices or components according to embodiments of the present disclosure described herein may be implemented utilizing any suitable hardware, firmware (e.g., an application-specific integrated circuit), software, or a combination of software, firmware, and hardware. For example, the one or more suitable components of the display device may be formed on one integrated circuit (IC) chip or on separate IC chips. Further, the one or more suitable components of the display device may be implemented on a flexible printed circuit film, a tape carrier package (TCP), a printed circuit board (PCB), or formed on one substrate. Further, the one or more suitable components of the display device may be a process or thread, running on one or more processors, in one or more computing devices, executing computer program instructions and interacting with other system components for performing the one or more suitable functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of one or more suitable computing devices may be combined or integrated into a single computing device, or the functionality of a particular computing device may be distributed across one or more other computing devices without departing from the scope of the embodiments of the present disclosure.

In the context of the present application and unless otherwise defined, the terms "use," "using," and "used" may be considered synonymous with the terms "utilize," "utilizing," and "utilized," respectively.

A person of ordinary skill in the art, in view of the present disclosure in its entirety, would appreciate that each suitable feature of the one or more suitable embodiments of the present disclosure may be combined or combined with each other, partially or entirely, and may be technically interlocked and operated in one or more suitable ways, and each embodiment may be implemented independently of each other or in conjunction with each other in any suitable manner unless otherwise stated or implied.

It should be understood that embodiments described herein should be considered in a descriptive sense only and not for purposes of limitation. Descriptions of features or aspects within each embodiment should typically be considered as available for other similar features or aspects in one or more embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A display device comprising:

a display panel;

a panel support member on the display panel;

a barrier film between the display panel and the panel support member; and a lower visibility prevention member on an opposite side of the barrier film, wherein the panel support member comprises:

a first support;

a second support spaced from the first support in a second direction; and a differential pattern between the first support and the second support, the differential pattern comprising a plurality of first spacers and a plurality of second spacers, the first spacers and the second spacers being spaced from each other in a direction different from the second direction, a height of each of the first spacers being greater than a height of each of the second spacers, and an upper surface of each of the first spacers being in direct contact with a lower surface of the barrier film, wherein the panel support member is between the lower visibility prevention member and the barrier film, and a lower surface of a second spacer of the second spacers is spaced from an upper surface of the lower visibility prevention member.

2. The display device of claim 1, wherein an upper surface of each of the second spacers is spaced from the lower surface of the barrier film.

3. The display device of claim 1, wherein a hole is between the first spacer and the second spacer.

4. The display device of claim 1, wherein the differential pattern further comprises:

a bottom portion below the first spacer and each of the second spacers; and a groove between each of the first spacers and each of the second spacers.

5. The display device of claim 1, wherein a separation direction of the first support and the second support is equal to an extension direction of each of the first spacers and each of the second spacers.

6. The display device of claim 5, wherein a portion of the differential pattern protrudes from the first support to a first side, and another portion of the differential pattern protrudes from the second support to a second side different from the first side.

7. The display device of claim 1, wherein a first direction is an extension direction of each of the first spacers and each of the second spacers, and is different than the second direction, the second direction being a separation direction of the first support and the second support.

8. The display device of claim 7, wherein one end of the first support in the first direction further protrudes than one end of the differential pattern in the first direction.

9. The display device of claim 1, further comprising a buffer layer on the differential pattern, wherein the buffer layer is in contact with an upper surface or a lower surface of each of the first spacers.

10. The display device of claim 9, wherein the buffer layer is between the first support and the second support.

11. The display device of claim 10, wherein a side surface of the buffer layer is spaced from at least one of a side surface of the first support or a side surface of the second support.

12. The display device of claim 9, wherein an upper surface of the buffer layer further protrudes than upper surfaces of the first support and the second support, and the barrier film has a conformal shape along a protruding upper surface and a protruding side surface of the buffer layer.

13. A display device comprising:

a display panel;

a panel support member on the display panel and comprising a first support member and a second support member spaced from the first support member in a second direction;

a barrier film between the first support member and the second support member, and comprising a support layer, a first adhesive layer on one side of the support layer, and a second adhesive layer on a second side of the support layer; and a lower visibility prevention member on an opposite side of the barrier film, wherein the panel support member further comprises a differential pattern between the first support member and the second support member, the differential pattern comprising first spacers and second spacers, the first spacers and the second spacers being spaced from each other in a direction different from the second direction, a height of each of the first spacers being greater than a height of each of the second spacers, and an upper surface of each of the first spacers being in direct contact with a lower surface of the barrier film, wherein the panel support member is between the lower visibility prevention member and the barrier film, a second spacer of the second spacers is spaced from an upper surface of the lower visibility prevention member, and a separation direction of the first support member and the second support member is different from a stacking direction of the support layer, the first adhesive layer, and the second adhesive layer.

14. The display device of claim 13, further comprising a buffer layer between the display panel and the panel support member, wherein the first adhesive layer is in direct contact with the buffer layer, and the second adhesive layer is in direct contact with the lower visibility prevention member.

15. The display device of claim 13, further comprising a buffer layer between the barrier film and the lower visibility prevention member, wherein the second adhesive layer is in direct contact with the buffer layer.

16. An electronic device comprising:

a display device comprising a folding area, a first non-folding area, and a second non-folding area;

a first support member overlapping the first non-folding area;

a second support member overlapping the second non-folding area; and a hinge overlapping the folding area;

wherein the display device comprises:

a display panel;

a panel support member on the display panel;

a barrier film between the display panel and the panel support member; and a lower visibility prevention member on an opposite side of the barrier film, wherein the panel support member comprises:

a first support;

a second support spaced from the first support in a second direction; and a differential pattern between the first support and the second support and comprising first spacers and second spacers being spaced from each other in a direction different from the second direction, a height of each of the first spacers being greater than a height of each of the second spacers, and an upper surface of each of the first spacers being in direct contact with a lower surface of the barrier film, wherein the panel support member is between the lower visibility prevention member and the barrier film, and a second spacer of the second spacers is spaced from an upper surface of the lower visibility prevention member.

17. The electronic device of claim 16, wherein the electronic device is a smartphone, a television, a monitor, a tablet, an electric vehicle, a mobile phone, a tablet personal computer (PC), a mobile communication terminal, an electronic notebook, an electronic book, a portable multimedia player (PMP), a navigation device, an ultra-mobile PC (UMPC), a laptop computer, a billboard, an Internet of Things (IoT) device, a smartwatch, a watch phone, or a head-mounted display (HMD).

* * * * *